(12) United States Patent
Zhao et al.

(10) Patent No.: US 10,691,024 B2
(45) Date of Patent: Jun. 23, 2020

(54) HIGH-POWER SHORT-PASS TOTAL INTERNAL REFLECTION FILTER

(71) Applicant: KLA-Tencor Corporation, Milpitas, CA (US)

(72) Inventors: Wei Zhao, Sunnyvale, CA (US); Ilya Bezel, Mountain View, CA (US)

(73) Assignee: KLA-Tencor Corporation, Milpitas, CA (US)

(*) Notice: Subject to any disclaimer, the term of this patent is extended or adjusted under 35 U.S.C. 154(b) by 0 days.

(21) Appl. No.: 16/165,799

(22) Filed: Oct. 19, 2018

(65) Prior Publication Data

US 2019/0235390 A1 Aug. 1, 2019

Related U.S. Application Data

(60) Provisional application No. 62/622,276, filed on Jan. 26, 2018.

(51) Int. Cl.
| | | |
|---|---|---|
| *H01J 61/02* | (2006.01) | |
| *G03F 7/20* | (2006.01) | |
| *H05H 1/24* | (2006.01) | |
| *H01J 65/04* | (2006.01) | |

(Continued)

(52) U.S. Cl.
CPC ........ *G03F 7/70033* (2013.01); *H01J 23/033* (2013.01); *H01J 61/025* (2013.01); *H01J 61/54* (2013.01); *H01J 65/042* (2013.01); *H05H 1/24* (2013.01)

(58) Field of Classification Search
CPC .......... H01J 61/02; H01J 61/025; H01J 65/00; H01J 65/04; H01J 65/042; H05H 1/24; H05H 1/46; H01S 3/09; H01S 3/097
See application file for complete search history.

(56) References Cited

U.S. PATENT DOCUMENTS

| | | | |
|---|---|---|---|
| 4,697,881 A | 10/1987 | Brown | |
| 7,784,954 B1 * | 8/2010 | Coleman | G02B 5/021 362/19 |
| 7,786,455 B2 | 8/2010 | Smith | |

(Continued)

FOREIGN PATENT DOCUMENTS

JP 2011221376 A 11/2011

OTHER PUBLICATIONS

International Search Report and Written Opinion dated May 10, 2019 for PCT/US2019/015138.

(Continued)

*Primary Examiner* — Jason Crawford
(74) *Attorney, Agent, or Firm* — Suiter Swantz pc llo

(57) ABSTRACT

An apparatus for generating filtered light may include a broadband illumination source configured to generate broadband illumination and a total internal reflection (TIR) filter formed from a material at least partially transparent to the broadband illumination. The TIR filter may include one or more input faces oriented to receive the broadband illumination. The TIR filter may further be oriented to reflect wavelengths of the broadband illumination beam below a selected cutoff wavelength on one or more filtering faces as filtered broadband illumination and provide the filtered broadband illumination beam through one or more output faces. The cutoff wavelength may further be selected based on total internal reflection on the one or more faces.

21 Claims, 16 Drawing Sheets

(51) Int. Cl.
*H01J 23/033* (2006.01)
*H01J 61/54* (2006.01)

(56) References Cited

U.S. PATENT DOCUMENTS

| | | | |
|---|---|---|---|
| 9,099,292 B1 | 8/2015 | Bezel et al. | |
| 9,185,788 B2 | 11/2015 | Bezel et al. | |
| 9,558,858 B2* | 1/2017 | Shortt | G21K 5/00 |
| 9,709,811 B2 | 7/2017 | Shchemelinin et al. | |
| 9,775,226 B1 | 9/2017 | Bezel et al. | |
| 2006/0152931 A1* | 7/2006 | Holman | F21S 8/08 |
| | | | 362/297 |
| 2007/0228288 A1 | 10/2007 | Smith | |
| 2008/0026346 A1 | 1/2008 | Holmer et al. | |
| 2009/0128881 A1 | 5/2009 | Penn | |
| 2009/0314967 A1 | 12/2009 | Moriya et al. | |
| 2010/0097699 A1 | 4/2010 | Destain et al. | |
| 2010/0278480 A1 | 11/2010 | Vasylyev | |
| 2011/0188040 A1* | 8/2011 | He | G01J 4/00 |
| | | | 356/365 |
| 2013/0003384 A1* | 1/2013 | Bezel | G02B 26/06 |
| | | | 362/276 |
| 2013/0106275 A1 | 5/2013 | Chimmalgi et al. | |
| 2013/0169140 A1* | 7/2013 | Ko | H01J 65/04 |
| | | | 313/111 |
| 2013/0181595 A1 | 7/2013 | Bezel et al. | |
| 2013/0207004 A1 | 8/2013 | Ceglio et al. | |
| 2014/0291546 A1* | 10/2014 | Bezel | H01J 65/00 |
| | | | 250/432 R |
| 2015/0034838 A1* | 2/2015 | Bezel | H01J 65/04 |
| | | | 250/432 R |
| 2015/0048741 A1* | 2/2015 | Shortt | G21K 5/00 |
| | | | 315/111.41 |
| 2015/0049778 A1* | 2/2015 | Shchemelinin | G02B 27/1006 |
| | | | 372/76 |
| 2016/0066402 A1 | 3/2016 | Bezel et al. | |
| 2017/0059490 A1 | 3/2017 | Zhao et al. | |
| 2017/0315369 A1* | 11/2017 | Shchemelinin | G02B 27/1006 |

OTHER PUBLICATIONS

International Search Report and Written Opinion dated Aug. 8, 2019 for PCT/US2019/015040.

* cited by examiner

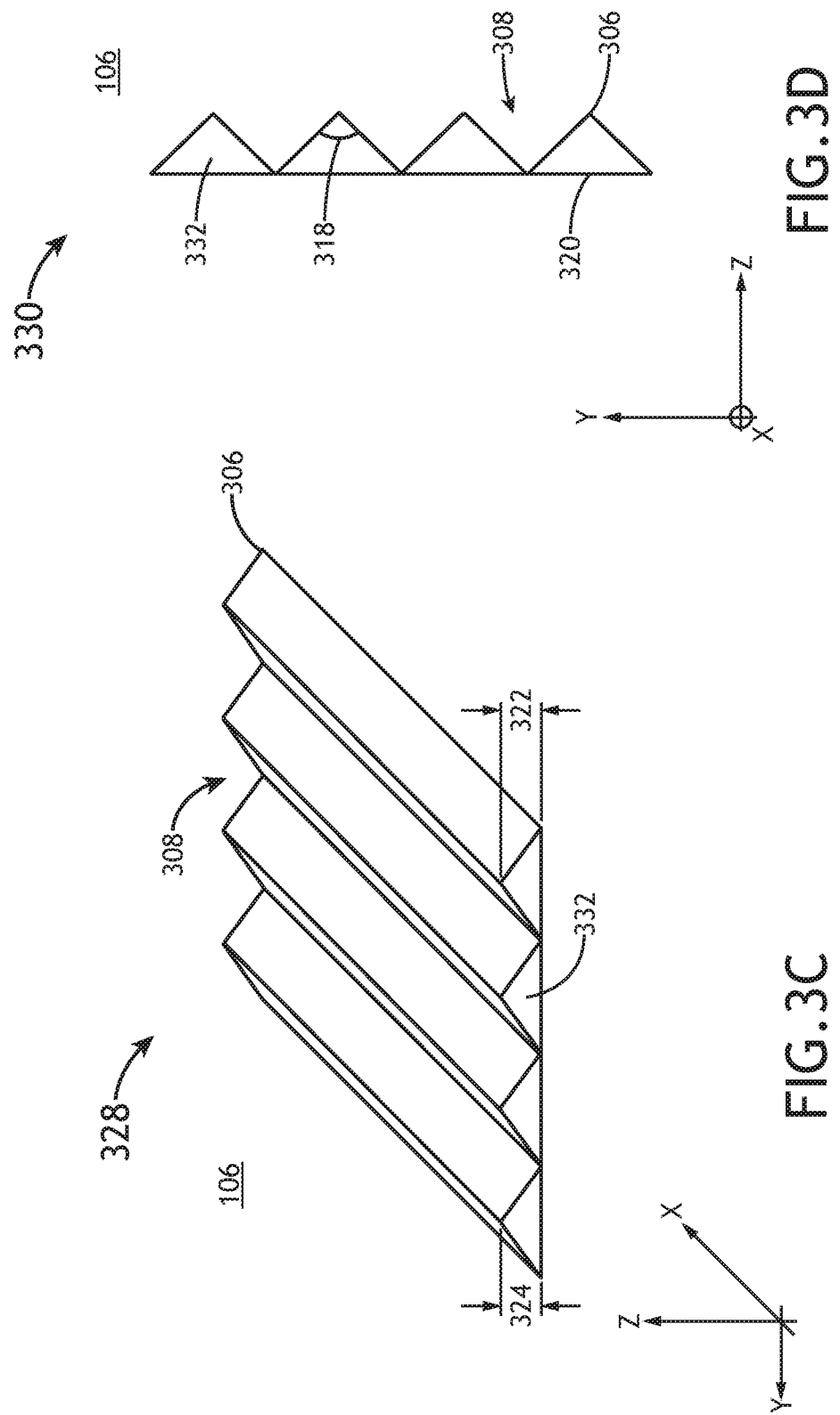

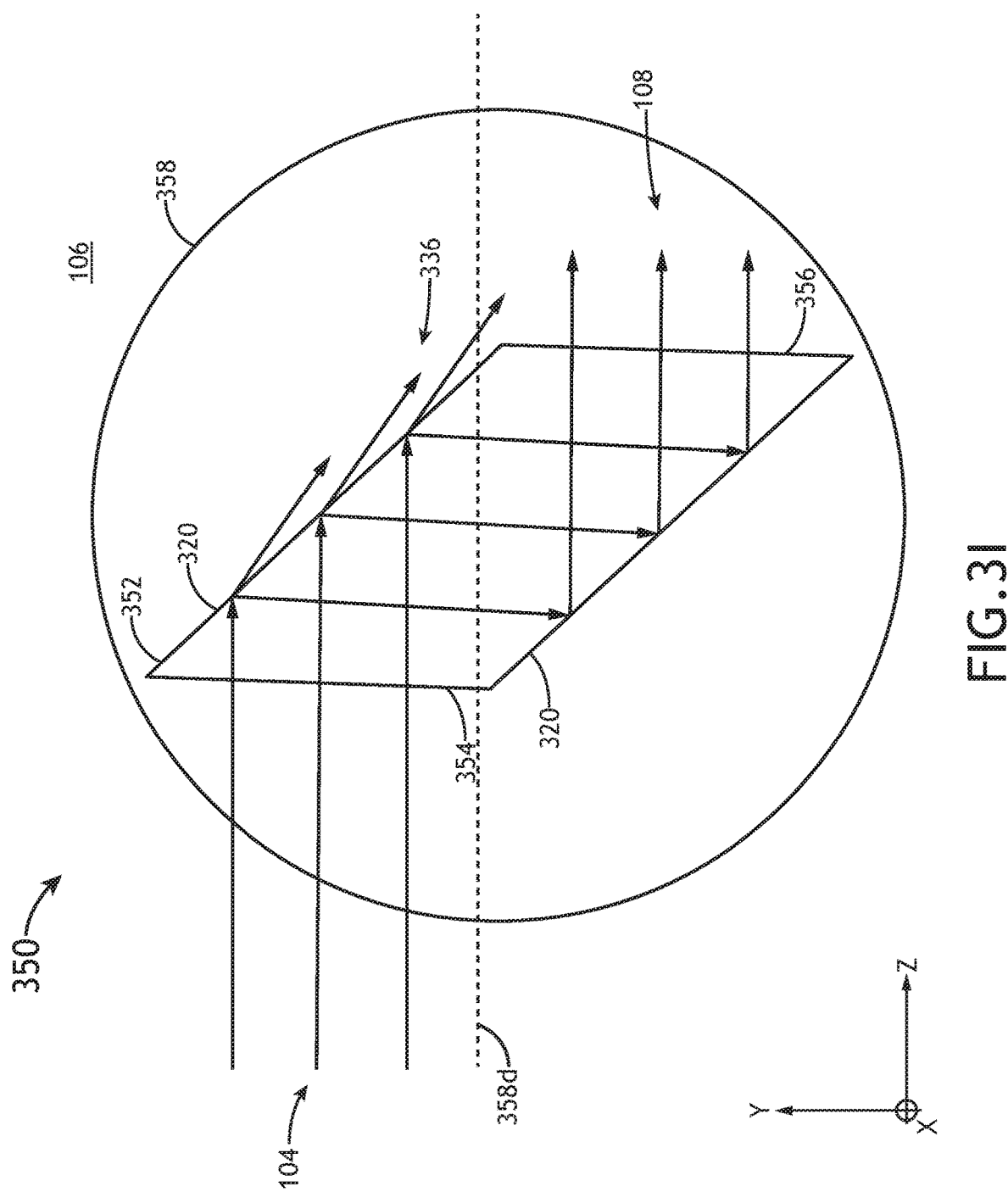

500

502 — PROVIDING A TIR FILTER FORMED FROM A SOLID MATERIAL INCLUDING ONE OR MORE INPUT FACES CONFIGURED TO RECEIVE BROADBAND ILLUMINATION, ONE OR MORE SELECTED FACES SUITABLE FOR REFLECTING THE BROADBAND ILLUMINATION, AND ONE OR MORE OUTPUT FACES CONFIGURED TO PASS THE REFLECTED BROADBAND ILLUMINATION

504 — ORIENTING THE TIR FILTER TO REFLECT WAVELENGTHS OF THE BROADBAND ILLUMINATION BELOW A SELECTED CUTOFF WAVELENGTH BY TOTAL INTERNAL REFLECTION BY THE ONE OR MORE SELECTED FACES

FIG.5

HIGH-POWER SHORT-PASS TOTAL INTERNAL REFLECTION FILTER

CROSS-REFERENCE TO RELATED APPLICATION

The present application claims the benefit under 35 U.S.C. § 119(e) of U.S. Provisional Application Ser. No. 62/622,276 filed Jan. 26, 2018, entitled HIGH-POWER SHORT PASS VUV FILTER BASED ON TOTAL INTERNAL REFLECTION, naming Wei Zhao and Ilya Bezel as inventors, which is incorporated herein by reference in the entirety.

TECHNICAL FIELD

The present disclosure relates generally to high-power filters and, more particularly, to short-pass filtering of high-power ultraviolet radiation.

BACKGROUND

High-power ultraviolet (UV) light sources are critical for the fabrication and inspection of integrated circuits with ever-shrinking feature sizes. In particular, optical diffraction constrains the size and density of features that may be fabricated and optically inspected. Accordingly, fabrication and inspection of integrated circuits is commonly performed with UV light, which may broadly include various spectral bands such as, but not limited to, deep ultraviolet light (DUV), vacuum ultraviolet (VUV) light, or extreme ultraviolet (EUV) light.

High-power sources of UV light typically generate broadband radiation such that undesired wavelengths (e.g., out-of-band wavelengths) are filtered to provide an illumination beam having a selected range of wavelengths. However, undesired or excessive absorption of out-of-band wavelengths practically limits traditional filtering techniques. For example, conventional dielectric coating filters rely on absorption of undesired wavelengths, which may result in excessive heating, distortion, and/or damage based on the intensity of light in the out-of-band wavelengths. By way of another example, many traditional filtering techniques such as, but not limited to, spatial-selective filters or transmissivity of light through a material. However, many materials have absorption bands in UV spectral bands that limit the practical thickness and/or lifespan of transmissive optical components used in filters, again due to excessive heating or damage. Therefore, it is desirable to provide a system and method that cures the above deficiencies.

SUMMARY

An apparatus for generating filtered light is disclosed in accordance with one or more illustrative embodiments of the present disclosure. In one illustrative embodiment, the apparatus includes one or more pump sources configured to generate pump illumination. In another illustrative embodiment, the apparatus includes a focusing element arranged to focus the pump illumination onto a plasma target to generate a plasma that emits broadband illumination. In another illustrative embodiment, the apparatus includes a collector element arranged to collect the broadband illumination from the plasma. In another illustrative embodiment, the apparatus includes a total internal reflection (TIR) filter formed from a material at least partially transparent to the broadband illumination. In another illustrative embodiment, the TIR filter includes one or more input faces oriented to receive the broadband illumination and one or more filtering faces oriented to reflect wavelengths of the broadband illumination beam below a selected cutoff wavelength as filtered broadband illumination, where the cutoff wavelength is selected based on total internal reflection on the one or more filtering faces. In another illustrative embodiment, the filtered broadband illumination beam exits the TIR filter through one or more output faces.

An apparatus for generating filtered light is disclosed in accordance with one or more illustrative embodiments of the present disclosure. In one illustrative embodiment, the apparatus includes a broadband illumination source configured to generate broadband illumination. In another illustrative embodiment, the apparatus includes a total internal reflection (TIR) filter formed from a material at least partially transparent to the broadband illumination. In another illustrative embodiment, the TIR filter includes one or more input faces oriented to receive the broadband illumination and one or more filtering faces oriented to reflect wavelengths of the broadband illumination beam below a selected cutoff wavelength as filtered broadband illumination, where the cutoff wavelength is selected based on total internal reflection on the one or more filtering faces. In another illustrative embodiment, the filtered broadband illumination beam exits the TIR filter through one or more output faces.

A total internal reflection (TIR) filter is disclosed in accordance with one or more illustrative embodiments of the present disclosure. In one illustrative embodiment, the TIR filter includes a solid material including one or more input faces oriented to receive broadband illumination, where the solid material is at least partially transparent to the broadband illumination. In another illustrative embodiment, the TIR filter includes one or more filtering faces oriented to reflect wavelengths of the broadband illumination beam propagating through the solid material below a selected cutoff wavelength as filtered broadband illumination, where the cutoff wavelength is selected based on total internal reflection on the one or more faces. In another illustrative embodiment, the TIR filter includes one or more output faces oriented to receive the filtered broadband illumination and direct the filtered broadband illumination as an output beam.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF DRAWINGS

The numerous advantages of the disclosure may be better understood by those skilled in the art by reference to the accompanying figures in which:

FIG. 3C is a perspective view of a Fresnel prism having a total thickness equal to the groove height, in accordance with one or more embodiments of the present disclosure.

FIG. 3D is a side view of a Fresnel prism having a total thickness equal to the groove height, in accordance with one or more embodiments of the present disclosure.

FIG. 3I is a side view of a TIR short-pass filter including a rhomboid prism, in accordance with one or more embodiments of the present disclosure.

FIG. 5 is a flow diagram of a method for filtering broadband illumination, in accordance with one or more embodiments of the present disclosure.

DETAILED DESCRIPTION

Figure 1A:
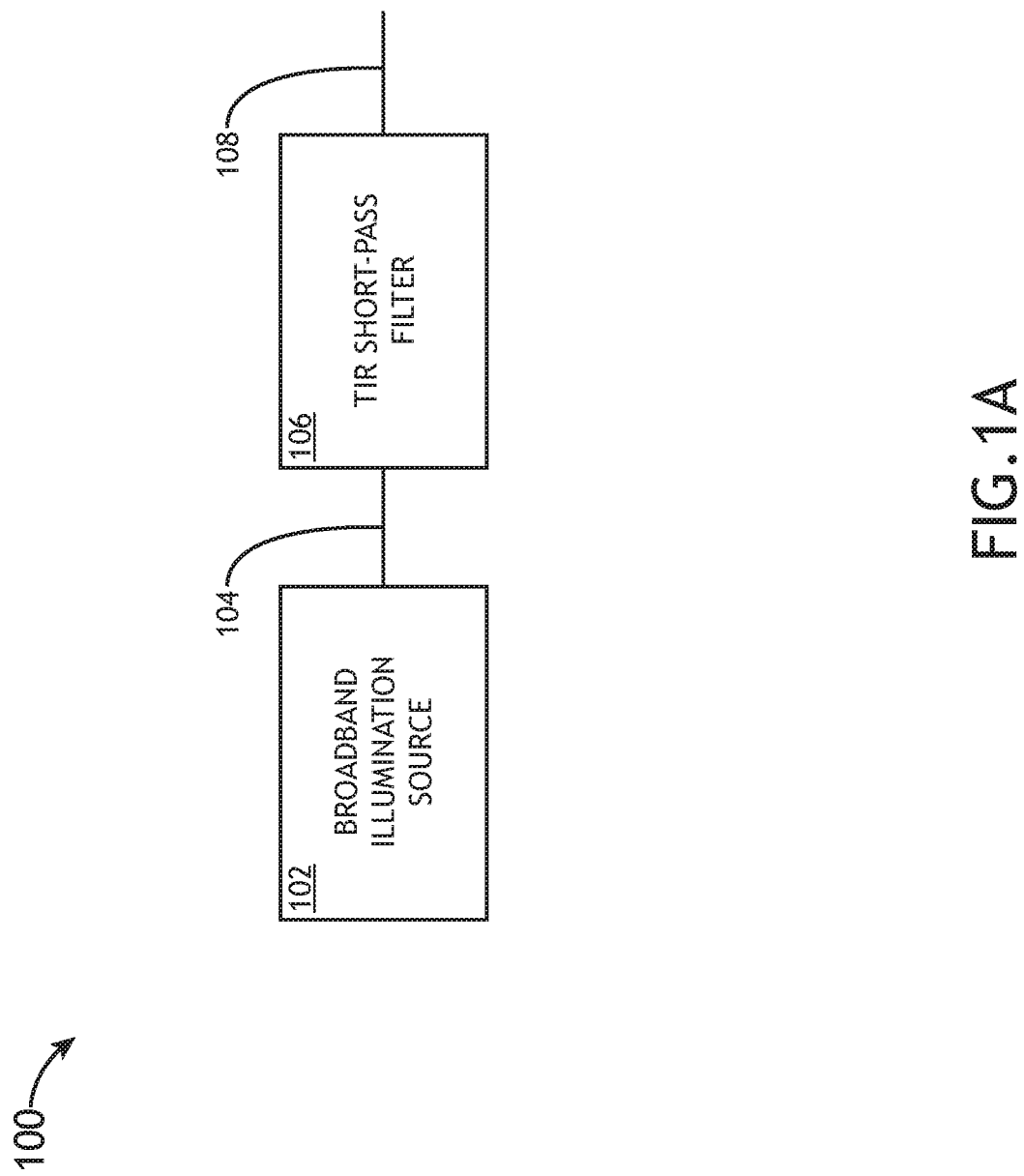
FIG. 1A is a diagrammatic view of a TIR spectral filter within a system for generating broadband illumination, in accordance with one or more embodiments of the present disclosure.

Reference will now be made in detail to the subject matter disclosed, which is illustrated in the accompanying drawings. The present disclosure has been particularly shown and described with respect to certain embodiments and specific features thereof. The embodiments set forth herein are taken to be illustrative rather than limiting. It should be readily apparent to those of ordinary skill in the art that various changes and modifications in form and detail may be made without departing from the spirit and scope of the disclosure.

Embodiments of the present disclosure are directed to systems and methods for filtering broadband illumination with a short-pass filter based on total-internal-reflection (TIR). Some embodiments of the present disclosure are directed to receiving broadband illumination and filtering (e.g., separating) selected in-band wavelengths of the broadband illumination from undesired out-of-band wavelengths of the broadband illumination with a TIR-based short-pass filter. For example, in-band wavelengths may include UV wavelengths suitable for the fabrication and/or inspection of integrated circuits such as, but not limited to, DUV wavelengths, VUV wavelengths or EUV wavelengths.

It is recognized herein that the critical angle associated with total internal reflection at an interface between two materials depends on wavelength as well as the refractive indices of the two materials. In some embodiments, a TIR-based short-pass filter may include a transmissive material at least partially transparent to input broadband illumination to be filtered. The broadband illumination may enter the filter through one or more input faces and be incident on a reflecting face at an angle selected to provide total internal reflection for the in-band wavelengths, while out-of-band wavelengths may propagate through the interface. The reflected in-band illumination may then exit the filter through one or more output faces. Further, TIR may provide highly efficient reflection (at or near 100% reflection) of the in-band wavelengths.

It is further recognized herein that the transmissivity of any wavelength of light on an interface at an angle smaller than the critical angle for TIR further depends on the angle of incidence as well as the refractive indices of the two materials surrounding the interface. For instance, the reflection and transmission of light through an interface may be generally described by the Fresnel equations. In some embodiments, a short-pass filter includes one or more anti-reflective (AR) surfaces tuned to facilitate a high contrast ratio between passed in-band wavelengths and rejected out-of-band wavelengths. For example, input and output faces of the short-pass filter may include AR surfaces tuned to mitigate reflections of at least the in-band wavelengths and thus mitigate loss associated with the in-band wavelengths entering and exiting the filter. By way of another example, external surfaces of reflecting faces of the filter may include AR surfaces tuned to the out-of-band wavelengths. In this regard, the AR surfaces may facilitate transmission of the energy of out-of-band wavelengths out of the filter.

In some embodiments, the short-pass filter includes a Fresnel prism to reduce and/or minimize the path length of in-band wavelengths through the filter. A Fresnel prism may include a surface with a periodic distribution of angled faces having a common apex angle. Properties of a Fresnel prism may thus be substantially similar to properties of a triangular prism with a corresponding apex angle. However, path lengths through a Fresnel prism may be substantially reduced relative to a triangular prism.

Some embodiments of the present disclosure are directed to an illumination source including a TIR-based short-pass filter to provide selected wavelengths of illumination. For example, broadband illumination may be, but is not required to be, generated using a laser-sustained plasma (LSP) light source. LSPs may operate by laser radiation onto a target in order to excite the target material into a plasma state that emits broadband light (e.g., broadband illumination, broadband radiation, or the like). Broadband light emitted by a plasma may exhibit a wide range of wavelengths ranging from EUV through infrared (IR) based on the target material as well as operating conditions (temperature, pressure, and the like). Accordingly, a TIR-based short-pass filter may pass selected wavelengths of plasma-generated light such as, but not limited to, VUV light suitable for the fabrication and/or inspection of integrated circuits.

FIGS. 1A through 1E illustrate a system 100 for generating broadband illumination equipped with a TIR-based spectral filter, in accordance with one or more embodiments of the present disclosure. The generation of plasma within inert gas species is generally described in U.S. patent application Ser. No. 11/695,348, filed on Apr. 2, 2007; and U.S. Patent Publication No. 2007/0228288, filed on Mar. 31, 2006, which are incorporated herein in their entirety. Various plasma cell designs and plasma control mechanisms are described in U.S. Patent Publication No. 2013/0106275, filed on Oct. 9, 2012, which is incorporated herein by reference in the entirety. The generation of plasma is also generally described in U.S. Patent Publication No. 2014/0291546, filed on Mar. 25, 2014, which is incorporated by reference herein in the entirety. Plasma cell and control mechanisms are also described in U.S. patent application Ser. No. 14/231,196, filed on Mar. 31, 2014, which is incorporated by reference herein in the entirety. Plasma cell and control mechanisms are also described in U.S. Pat. No. 9,185,788, filed on May 27, 2014, which is incorporated by reference herein in the entirety. Plasma cell and control mechanisms are also described in U.S. Patent Publication No. 2013/0181595, filed on Jan. 15, 2013, which is incorporated by reference herein in the entirety. In a general sense, the system 100 should be interpreted to extend to any plasma based light source known in the art.

FIG. 1A is a diagrammatic view of a TIR spectral filter within a system 100 for generating broadband illumination, in accordance with one or more embodiments of the present disclosure. In one embodiment, the system 100 includes a broadband illumination source 102 configured to generate broadband illumination 104 and a TIR short-pass filter 106 to pass wavelengths below a selected cutoff wavelength. Accordingly, the reflected wavelengths of the broadband illumination 104 may form filtered broadband illumination 108 that may exit the TIR short-pass filter 106 and be directed to external components.

In another embodiment, the cutoff wavelength of the TIR short-pass filter 106 is defined by total internal reflection on an internal surface of the TIR short-pass filter 106. For example, the broadband illumination 104 from the broadband illumination source 102 may be incident on an internal surface of the TIR short-pass filter 106 such that wavelengths of the broadband illumination 104 below the cutoff wavelength are reflected by total internal reflection at the internal surface and wavelengths of the broadband illumination 104 above the cutoff wavelength propagate through the internal surface.

In another embodiment, the broadband illumination 104 incident on the internal surface of the TIR short-pass filter 106 is collimated to provide a common incidence angle on the internal surface. The broadband illumination 104 may be collimated using any technique known in the art.

Figure 1B:
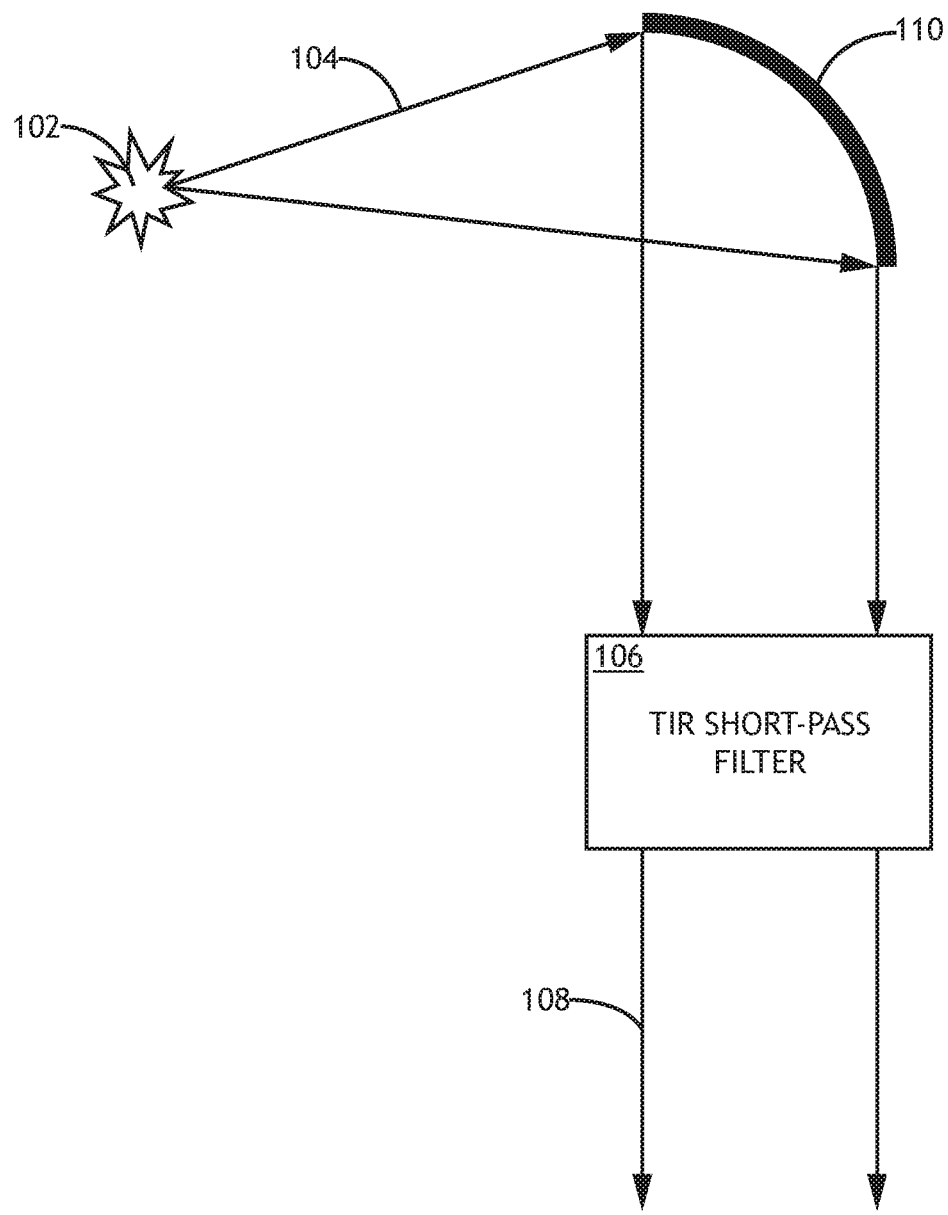
FIG. 1B is a conceptual view of a TIR spectral filter within a system for generating broadband illumination from a diverging broadband illumination source, in accordance with one or more embodiments of the present disclosure.

FIG. 1B is a conceptual view of a TIR spectral filter within the system 100 for generating broadband illumination from the diverging broadband illumination source 102, in accordance with one or more embodiments of the present disclosure. In one embodiment, a broadband illumination source 102 generates diverging broadband illumination 104 that may be collimated by a collector element 110 and directed to the TIR short-pass filter 106. In another embodiment, though not shown, a broadband illumination source 102 generates collimated light directly.

The broadband illumination source 102 may include any type of illumination source known in the art suitable for generating broadband illumination 104. Further, the broadband illumination source 102 may generate broadband illumination 104 having any wavelength or range of wavelengths such as, but not limited to, EUV wavelengths, VUV wavelengths, DUV wavelengths, UV wavelengths, visible wavelengths, or infrared (IR) wavelengths. In one embodiment, the broadband illumination source 102 includes a laser source (e.g., a supercontinuum laser source, a white light laser source, or the like) providing wavelengths within a selected bandwidth. In another embodiment, the broadband illumination source 102 includes a plasma source in which the broadband illumination 104 is generated by a plasma. In another embodiment, the broadband illumination source 102 includes a lamp source. In another embodiment, broadband illumination 104 is generated by subjecting pump illumination to nonlinear optical processes (e.g., self-phase modulation, or the like).

In one embodiment, the broadband illumination source 102 generates the broadband illumination 104 by generating a plasma. For example, the broadband illumination source 102 may ionize a plasma target material into a plasma state to generate broadband illumination 104 having wavelengths associated with one or more emission lines of the plasma target material. The plasma may be generated and/or maintained through any technique known in the art such as, but not limited to, electric discharges or focused laser energy. Further, a plasma target may include any type of material in any phase. For example, the plasma target may include a solid target mounted on a translation assembly configured to translate the solid target through and/or proximate to a generated plasma to provide a supply of target material. For instance, the plasma target may include, but is not limited to, a rotating drum target. By way of another example, the plasma target may include a liquid target configured to flow through and/or flow proximate to a generated plasma to provide a supply of target material. By way of another example, the plasma target may include a gas target configured to provide a supply of target material through convection and/or forced gas flow.

Figure 1C:
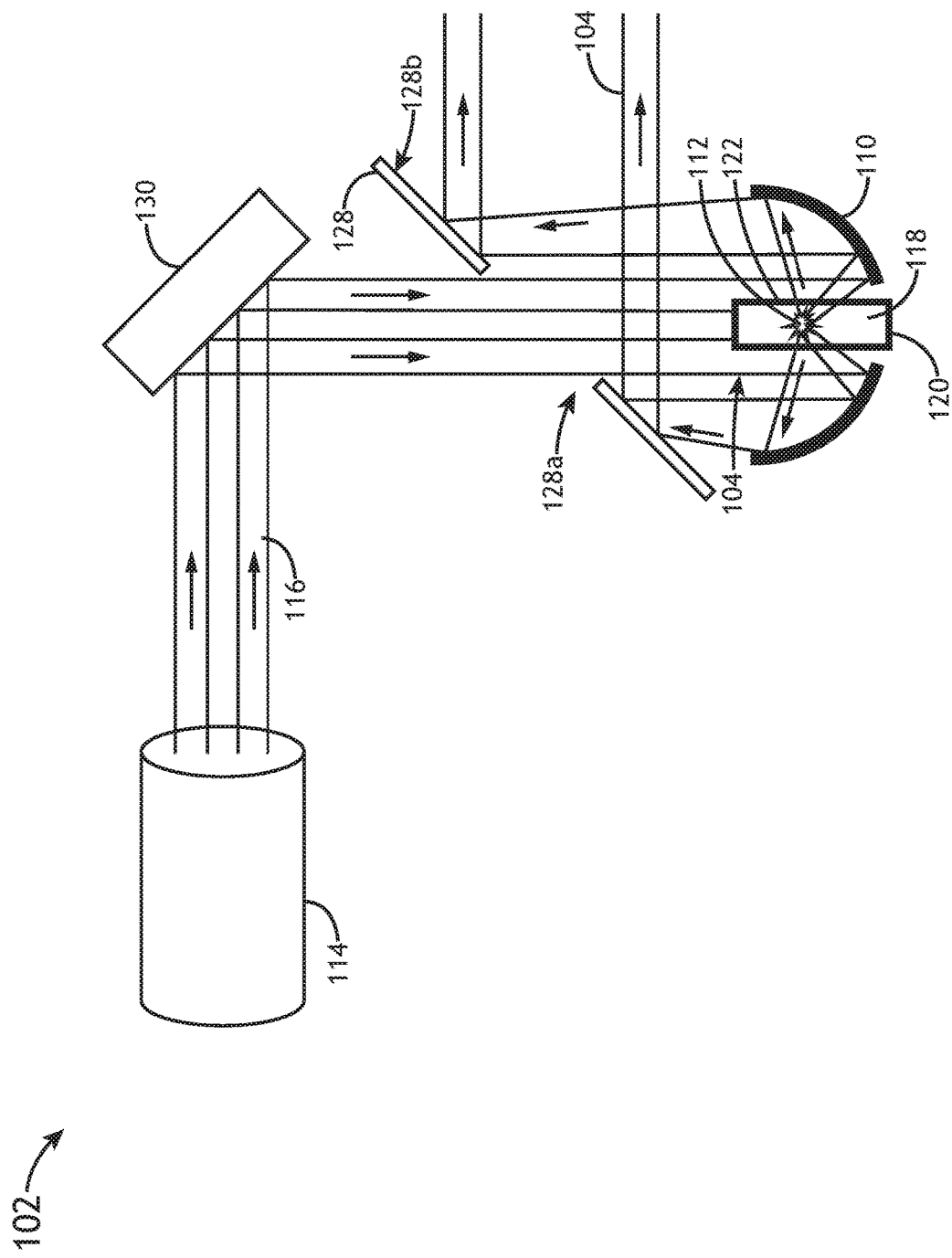
FIG. 1C is a conceptual view of a laser-sustained plasma (LSP) broadband illumination source including a plasma chamber, in accordance with one or more embodiments of the present disclosure.
Figure 1D:
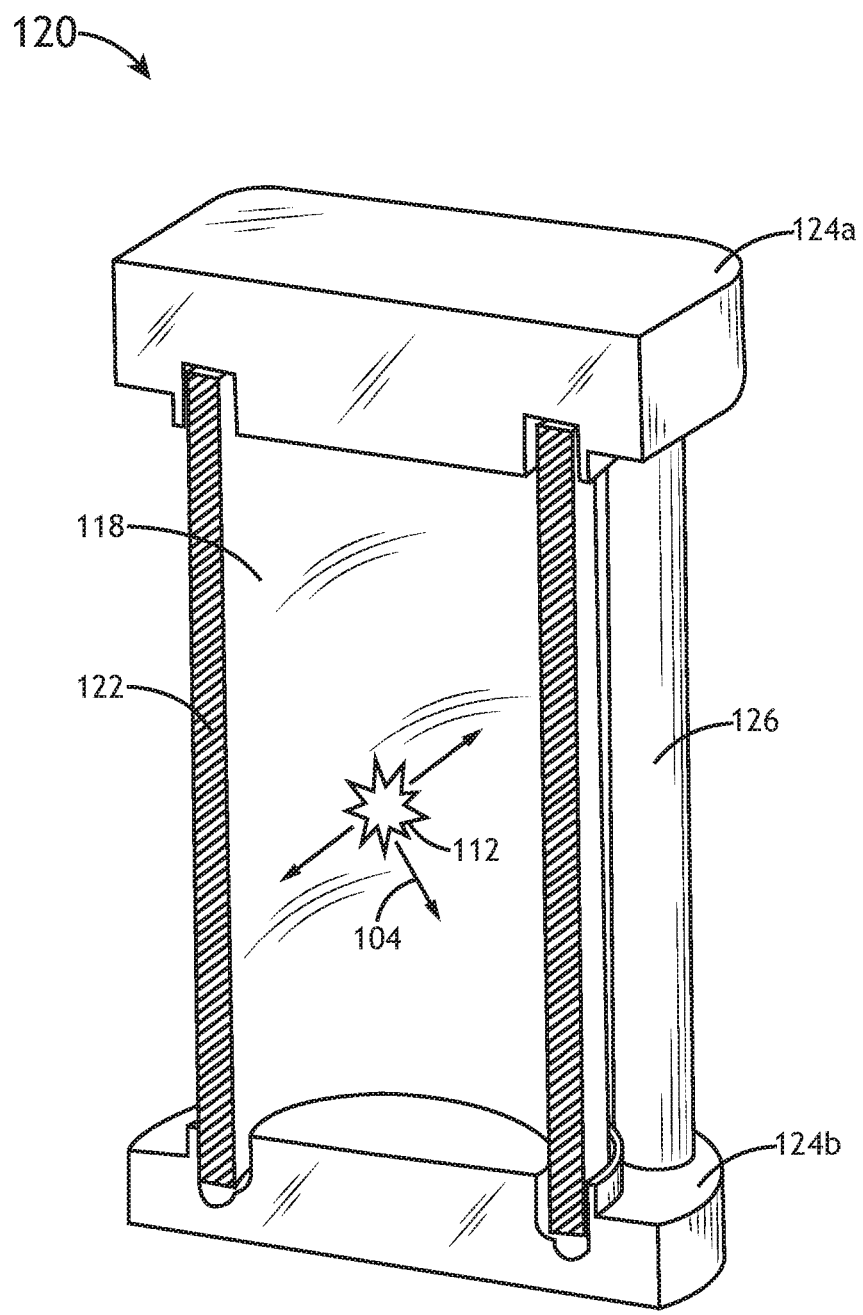
FIG. 1D is a conceptual view of a broadband illumination source including a plasma cell, in accordance with one or more embodiments of the present disclosure.
Figure 1E:
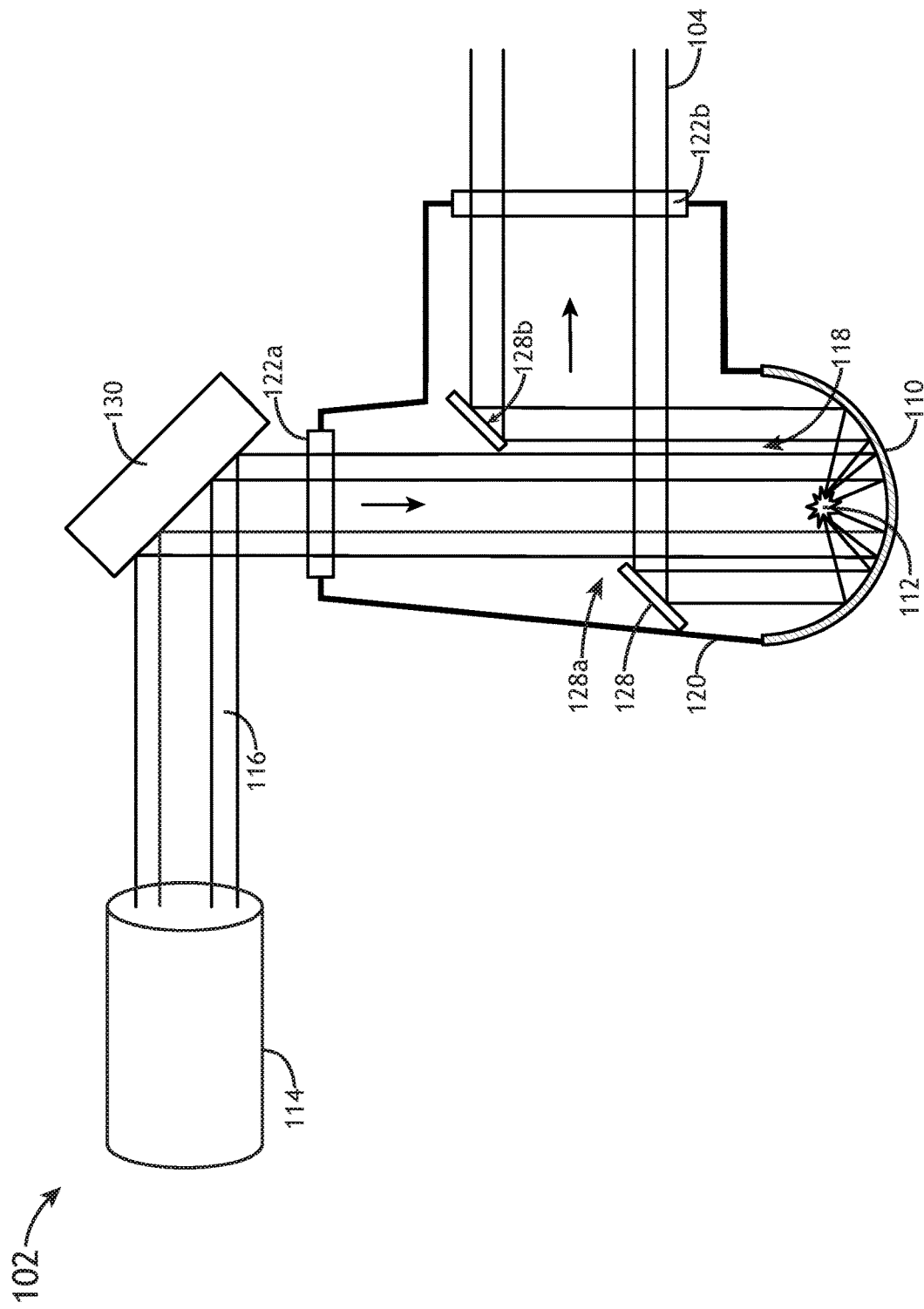
FIG. 1E is a conceptual view of a broadband illumination source including a plasma chamber, in accordance with one or more embodiments of the present disclosure.

Referring now to FIGS. 1C through 1E, a broadband illumination source 102 configured for the generation of a broadband illumination 104 based on the ionization of gaseous plasma target material is described. It is to be understood, however, that FIGS. 1C through 1E and the associated descriptions are provided solely for illustrative purposes and should not be interpreted as limiting. As described previously herein, a broadband illumination source 102 may generate broadband illumination 104 using any technique known in the art such as, but not limited to, laser emission from a laser cavity, spectral broadening through nonlinear optical processes, or ionizing a non-gaseous plasma target.

A gas-based LSP system 100 may be utilized to initiate and/or sustain a plasma 112 using a variety of gases. In one embodiment, the plasma target used to initiate and/or maintain the plasma 112 may include a noble gas, an inert gas (e.g., noble gas or non-noble gas), or a non-inert gas (e.g., mercury). In another embodiment, the plasma target may include a mixture of a noble gas and one or more trace materials (e.g., metal halides, transition metals and the like). For example, gases suitable for implementation in the present disclosure may include, but are not limited to, Xe, Ar, Ne, Kr, He, $N_2$, $H_2O$, $O_2$, $H_2$, $D_2$, $F_2$, $CH_4$, metal halides, halogens, Hg, Cd, Zn, Sn, Ga, Fe, Li, Na, K, Tl, In, Dy, Ho, Tm, ArXe, ArHg, ArKr, ArRn, KrHg, XeHg, and the like. In a general sense, the present disclosure should be interpreted to extend to any LSP system and any type of gas mixture suitable for sustaining a plasma 112. It is additionally noted herein that much of the emissions from atomic elements pumped in an LSP source is a result of line emission of highly-excited electron states of neutral species. In this regard, the plasma target may include any gas component suitable for emitting broadband illumination 104.

FIG. 1C is a conceptual view of a laser-sustained plasma (LSP) broadband illumination source 102 including a plasma chamber, in accordance with one or more embodiments of the present disclosure.

In another embodiment, the broadband illumination source 102 includes a pump illumination source 114 configured to generate pump illumination 116 including one or more selected wavelengths. For example, the pump illumination source 114 may generate pump illumination 116 having a selected wavelength or wavelength range suitable for generating and/or maintaining the plasma 112 within the gas containment structure 120 such as, but not limited to, infrared or visible wavelengths of radiation. In one instance, the pump illumination source 114 is tunable such that the wavelengths of the pump illumination 116 may be adjusted.

The pump illumination source 114 may include any type of illumination source suitable for generating and/or maintaining a plasma such as, but not limited to, one or more laser sources or one or more lamp sources. Further, the pump illumination source 114 may provide pump illumination 116 having any temporal profile. For example, the pump illumination source 114 may provide continuous-wave pump illumination 116, pulsed pump illumination 116, modulated pump illumination 116, or the like.

In one embodiment, a gaseous plasma target 118 is contained with a gas containment structure 120, which may include at least one transparent element 122 configured to transmit pump illumination 116 into the gas containment structure 120 and/or broadband illumination 104 emitted from the gas containment structure 120. FIG. 1D is a conceptual view of a broadband illumination source 102 including a plasma cell, in accordance with one or more embodiments of the present disclosure. In one embodiment, the gas containment structure 120 is a plasma cell including a transparent element 122 forming a hollow cylinder suitable for containing the gaseous plasma target 118. In another embodiment, the plasma cell includes one or more flanges 124a, 124b coupled to the transparent element 122. In another embodiment, the flanges 124a, 124b may be secured to the transparent element 122 (e.g., a hollow cylinder) using connection rods 126. The use of a flanged plasma cell is described in at least U.S. patent application Ser. No. 14/231, 196, filed on Mar. 31, 2014; and U.S. Pat. No. 9,185,788, filed on May 27, 2014, which are each incorporated previously herein by reference in the entirety.

In another embodiment, the system 100 includes a collector element 110 (e.g., an ellipsoid-shaped or a spherical-shaped collector element) configured to focus the pump illumination 116 into the gas containment structure 120 to generate and/or maintain a plasma 112. In particular, focusing the pump illumination 116 from the pump illumination source 114 into the volume of the plasma target 118 causes energy to be absorbed through one or more selected absorption lines of the gas plasma target 118 or plasma 112, thereby "pumping" the gas species of the plasma target 118 in order to generate or sustain the plasma 112. In another embodiment, although not shown, the broadband illumination source 102 may include a set of electrodes for generating the plasma 112 within the internal volume of the gas containment structure 120, whereby the pump illumination 116 may maintain the plasma 112 after ignition by the electrodes.

In another embodiment, the collector element 110 is arranged to collect broadband illumination 104 emitted by the plasma 112 and direct the broadband illumination 104 as a beam to one or more additional optical elements such as, but not limited to, the TIR short-pass filter 106.

In one embodiment, broadband illumination source 102 may include various additional optical elements. For example, the broadband illumination source 102 may include a mirror 128 arranged to direct illumination from the collector element 110 to downstream optics, such as, but not limited to the TIR short-pass filter 106. Further, the mirror 128 may include any type of mirror suitable for directing the broadband illumination 104 and/or transmitting the pump illumination 116, such as, but not limited to, a cold mirror or a mirror including one or more apertures. For example, as illustrated in FIG. 1C, the mirror 128 may include one or more apertures 128a to allow for pump illumination 116 to propagate to the collector element 110 and one or more reflective surfaces 128b for reflection of the broadband illumination 104 generated by the plasma 112.

Further, the broadband illumination source 102 includes one or more additional optical elements placed along either the illumination pathway or the collection pathway of broadband illumination source 102 for directing and/or conditioning light. For example, as illustrated in FIG. 1C, the broadband illumination source 102 may include a turning mirror 130 arranged to receive pump illumination 116 from the pump illumination source 114 and direct the pump illumination 116 to the plasma target 118 contained within the gas containment structure 120 via collector element 110.

It is to be understood, however, that the description of the LSP broadband illumination source 102 including a gas containment structure 120 configured as a plasma cell in FIGS. 1C and 1D is provided solely for illustrative purposes and should not be interpreted as limiting. It is anticipated that a number of equivalent optical configurations may be utilized within the scope of the present disclosure.

In a general sense, a gaseous-plasma based LSP broadband illumination source 102 may include any type of gas containment structure 120 known in the art. For example, FIG. 1E is a conceptual view of a broadband illumination source 102 including a plasma chamber, in accordance with one or more embodiments of the present disclosure. For example, the gas containment structure 120 may include a chamber suitable for containing a gas mixture and one or more optical components. In one embodiment, the one or more transparent elements 122 are configured as entrance and/or exit windows (e.g., input window 122a, output window 122b). The use of a self-contained gas chamber is described in U.S. Pat. No. 9,099,292, filed on May 26, 2010, which is incorporated herein by reference in the entirety. Further, as described previously herein, a broadband illumination source 102 may generate broadband illumination 104 using any technique known in the art such as, but not limited to, laser emission from a laser cavity, spectral broadening through nonlinear optical processes, or ionizing a non-gaseous plasma target.

Referring now to FIGS. 2 through 5, filtering the spectrum of broadband illumination 104 using a TIR short-pass filter 106 is described in more detail below.

In certain applications, only a portion of the spectral content of broadband illumination 104 from a broadband illumination source 102 may be desired. For example, a broadband illumination source 102 may provide light having a wide range of wavelengths across the electromagnetic spectrum such as, but not limited to, UV light (e.g., DUV light, VUV light, EUV light, or the like), visible light, and/or infrared light. However, it may be desirable to limit the wavelengths of illumination to a selected band such as, but not limited to, VUV light having wavelengths below approximately 200 nm. For example, longer-wavelength out-of-band light may decrease the practical optical resolution of systems based on the broadband illumination source 102 (e.g., metrology systems, inspection systems, lithography systems, or the like). By way of another example, longer-wavelength out-of-band light may induce undesirable heating and/or damage to downstream optical components.

It may be the case that broadband illumination 104 generated by the broadband illumination source 102 includes substantial energy in out-of-band wavelengths. For example, as described previously herein for the case of plasma emission, it is recognized herein that radiative emission of light in general is typically generated by exciting a material into an energetic state followed by the radiative emission of a photon as the energy is released from the material. Further, an excited material may typically have multiple energetic states such that energy may at least partially dissipate energy through multiple pathways associated with lower-energy emission. Accordingly, sources of high-photon energy (e.g., EUV sources, VUV sources, DUV sources, and the like) may be especially susceptible to the generation of unwanted lower-energy (longer wavelength) photons.

Accordingly, the TIR short-pass filter 106 may pass wavelengths below a selected cutoff wavelength based on total internal reflection on one or more backside surfaces of the TIR short-pass filter 106. The use of total internal reflection as the cutoff mechanism provides high-throughput of the selected wavelengths. Further, out-of-band wavelengths are transmitted through the backside surfaces rather than absorbed, which mitigates potential overheating and/or damage to the TIR short-pass filter 106 by the out-of-band wavelengths.

A TIR short-pass filter 106 may be formed from any material known the art at least partially transparent to the broadband illumination 104 and having a higher index of refraction than the surrounding medium to support total internal reflection of selected wavelengths. In one embodiment, the TIR short-pass filter 106 is formed from a liquid material enclosed in a container having windows at least partially transparent to the broadband illumination 104. In another embodiment, the TIR short-pass filter 106 is formed from a solid material such as, but not limited to, a glass material, a ceramic material, or a crystalline material. For example, a TIR short-pass filter 106 suitable for passing wavelengths below approximately 200 nm (e.g., 120 nm wavelengths) may be, but are not required to be, formed from $MgF_2$ or LiF. Further, the TIR short-pass filter 106 is suitable for passing wavelengths in any wavelength range. For instance, the TIR short-pass filter 106 may pass wavelengths below approximately 200 nm (e.g., in a range of approximately 115 nm to approximately 220 nm, in a range of approximately 115 nm to approximately 150 nm, in a range of approximately 115 nm to 130 nm, or the like). However, it is to be understood that descriptions of TIR cutoff wavelengths or passed wavelength ranges are provided solely for illustrative purposes and should not be interpreted as limiting. A TIR short-pass filter 106 may have any cutoff wavelength. Further, the absorption characteristics of a material forming the TIR short-pass filter 106 may introduce additional absorption that may impact the spectrum of the broadband illumination 104 and/or the filtered broadband illumination 108.

Figure 2:
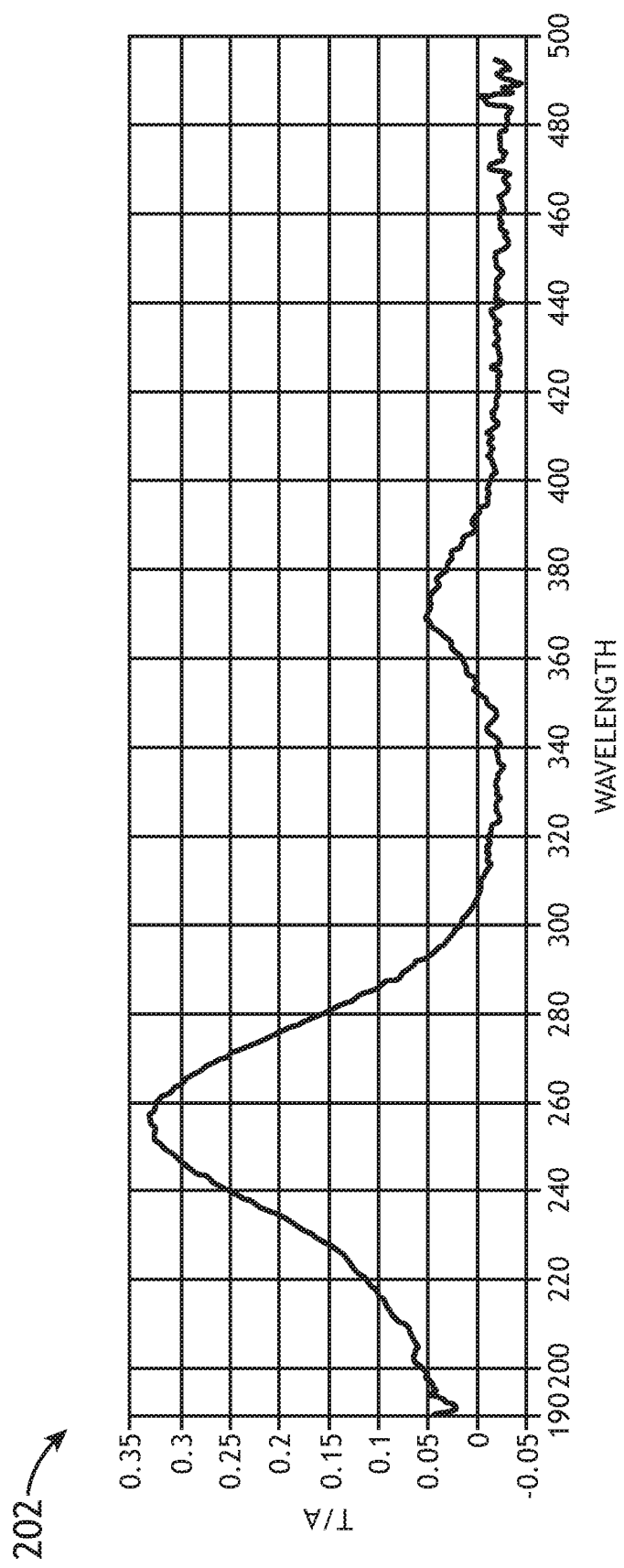
FIG. 2 is a plot of the absorption of $MgF_2$ in the range of 190 nm to 500 nm, in accordance with one or more embodiments of the present disclosure.

However, it is recognized herein that absorption of any wavelength in the TIR short-pass filter 106 may negatively impact performance by decreasing throughput and/or inducing damage that may limit the lifespan of the TIR short-pass filter 106. Further, many materials exhibit at least some absorption bands associated with at least a portion of the energy in a beam of broadband illumination 104. For example, although $MgF_2$ may be suitable for transmission of wavelengths below 200 nm (e.g., at 120 nm, or the like), it is susceptible to absorption-induced damage associated with the formation of F-center absorption bands. FIG. 2 is a plot 202 of the absorption of $MgF_2$ in the range of 190 nm to 500 nm, in accordance with one or more embodiments of the present disclosure. As illustrated in FIG. 2, $MgF_2$ exhibits an absorption band centered around approximately 258 nm with over 30% absorption at the peak as well as a weaker absorption band centered around 370 nm with around 5% absorption at the peak. Accordingly, $MgF_2$ may be susceptible to damage and excessive thermal stress due to absorption in this spectral range.

Figure 3A:
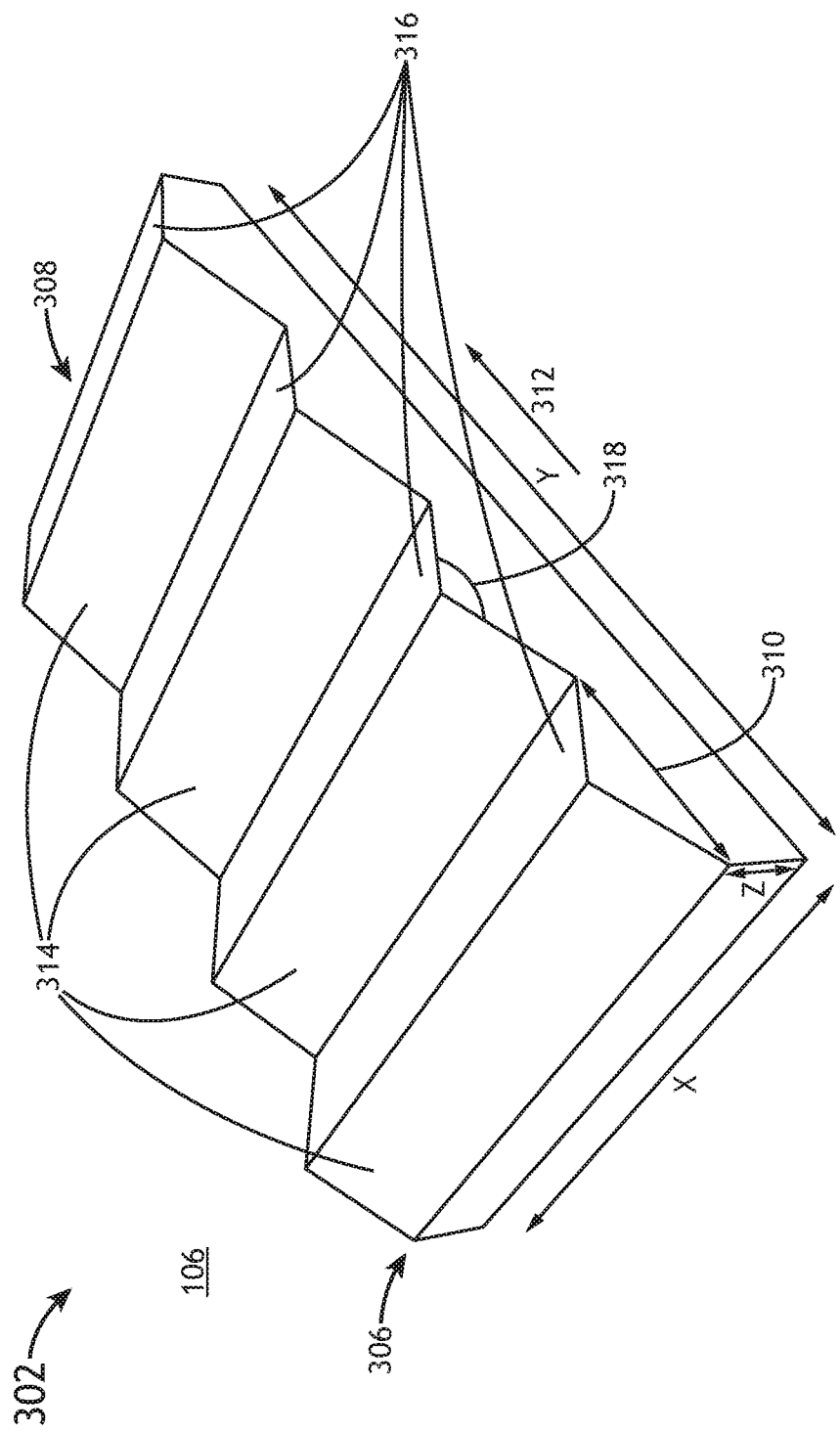
FIG. 3A is a perspective view of a TIR short-pass filter including a Fresnel prism, in accordance with one or more embodiments of the present disclosure.

A TIR short-pass filter 106 may have any geometry suitable for receiving broadband illumination 104 and reflecting the broadband illumination 104 off of an internal face of a surface such that a selected range of wavelengths are reflected via total internal reflection and subsequently exit the filter. FIGS. 3A through 4 illustrate multiple non-limiting embodiments of the TIR short-pass filter 106 in accordance with the present disclosure. For example, the TIR short-pass filter 106 may include, but is not required to include, a prism. In this regard, broadband illumination 104 may enter the TIR short-pass filter 106 through an input prism face and propagate through a portion of the prism material to one or more backside faces. A selected range of wavelengths may then undergo total internal reflection at the backside faces, propagate through another portion of prism material, and exit the prism through a prism face that may be the same as or different from the input face.

Referring now to FIGS. 3A through 3H, in some embodiments, a TIR short-pass filter 106 includes a Fresnel prism. A Fresnel prism may provide the benefits of total internal reflection filtering, while limiting the optical path of broadband illumination 104 through the TIR short-pass filter 106 to mitigate potential damage. For example, a traditional prism may include faces larger than a diameter of an input beam such that the overall dimensions of each prism face must be at least as large as the diameter of the beam on that face. Further, faces configured to reflect a beam must be sized based on the projection of the beam size along the angle of incidence and may thus be larger than the input beam size. In contrast, a Fresnel prism includes one or more grooved surfaces with periodically distributed angled faces (e.g., in a triangular pattern, a sawtooth pattern, or the like). In this regard, a Fresnel prism may provide multiple periodic prism elements having a common apex angle and angled faces facing a common direction, which may functionally combine to form a common prism face. Accordingly, a Fresnel prism may facilitate substantially the same function as a traditional prism, but with a reduced path length through the prism and thus less susceptibility to absorption-induced damage.

Figure 3B:
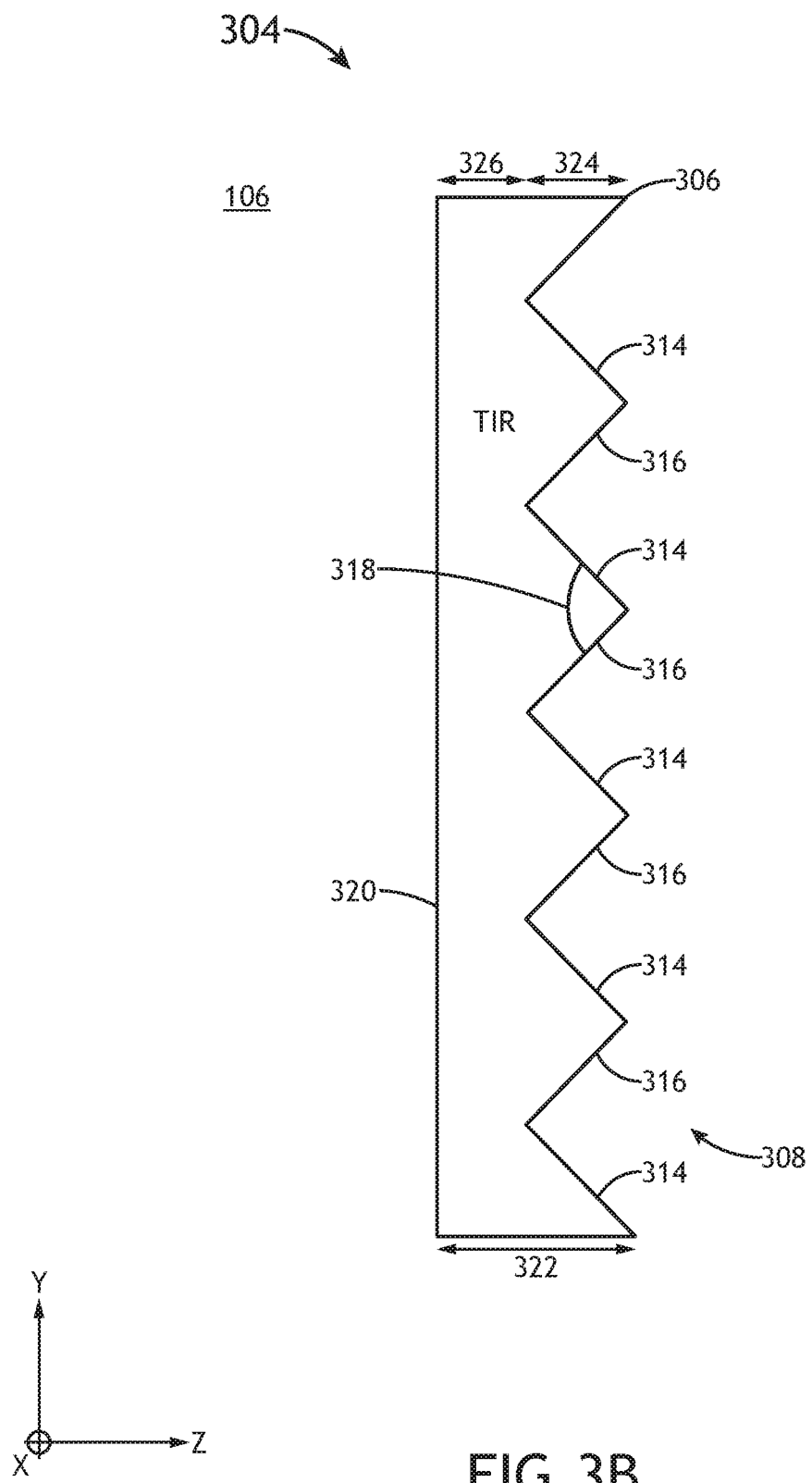
FIG. 3B is a side view of a TIR short-pass filter including a Fresnel prism, in accordance with one or more embodiments of the present disclosure.
Figure 4:
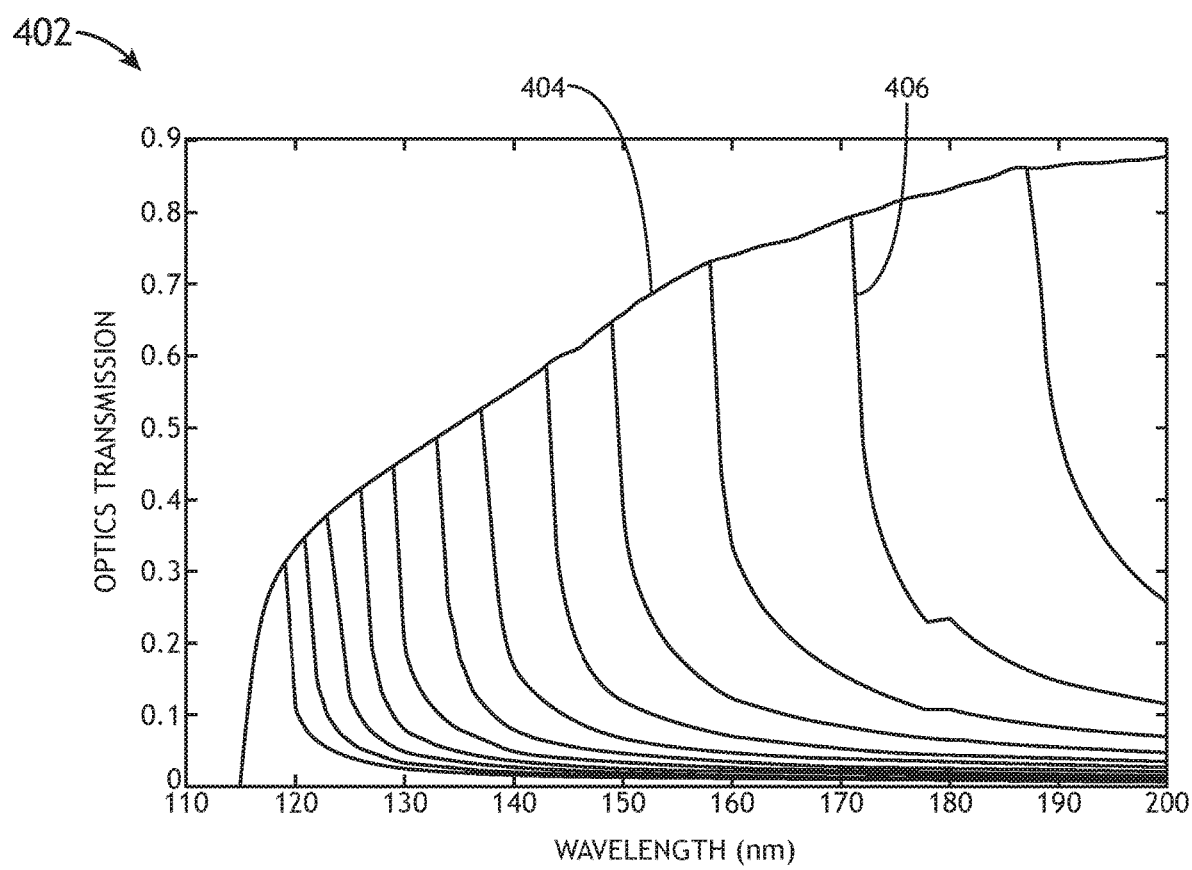
FIG. 4 is a plot illustrating the reflectivity of MgF2 as a function of wavelength for a range of incidence angles, in accordance with one or more embodiments of the present disclosure.

FIGS. 3A and 3B include a perspective view 302 and a side view 304 of a TIR short-pass filter 106 including Fresnel prism 306, respectively, in accordance with one or more embodiments of the present disclosure. In one embodiment, the Fresnel prism 306 includes a grooved surface 308 including angled faces periodically distributed with a pitch 310 along a distribution direction 312 (e.g., the Y direction here). For example, the grooved surface 308 may include a first set of groove faces 314 with surface normal vectors along a first direction interlaced with a second set of groove faces 316 with surface normal vectors along a second direction different than the first direction. In this regard, the first set of groove faces 314 and the second set of groove faces 316 may intersect with a selected apex angle 318. Further, the surface normal vectors for the first set of groove faces 314 and the second set of groove faces 316 may lie in a common plane with the distribution direction 312. In this regard, the first set of groove faces 314 and the second set of groove faces 316 may form a periodic groove structure extending along the Y direction. In another embodiment, the Fresnel prism 306 is further bounded by one or more flat surfaces 320. For example, the Fresnel prism 306 may include a flat surface 320 opposite the grooved surface 308 (e.g., in the X-Y plane) such that a thickness 322 of the Fresnel prism 306 may include a groove height 324 and a bulk thickness 326.

The Fresnel prism 306 may be configured with any bulk thickness 326. FIGS. 3C and 3D illustrate a perspective view 328 and a side view 330 of a Fresnel prism 306 having a total thickness 322 equal to the groove height 324, respectively, in accordance with one or more embodiments of the present disclosure. For example, the Fresnel prism 306 may be formed from a series of individual prism elements 332 set and/or fused in a periodic distribution. In this regard, a thickness 322 of the Fresnel prism 306 may be limited to the groove height 324 to further reduce the optical path through the Fresnel prism 306 and thus correspondingly reduce the susceptibility to absorption-induced damage.

Referring now to FIGS. 3E through 3H, possible beam paths through TIR short-pass filter 106 including a Fresnel prism 306 are illustrated, in accordance with one or more embodiments of the present disclosure.

Figure 3E:
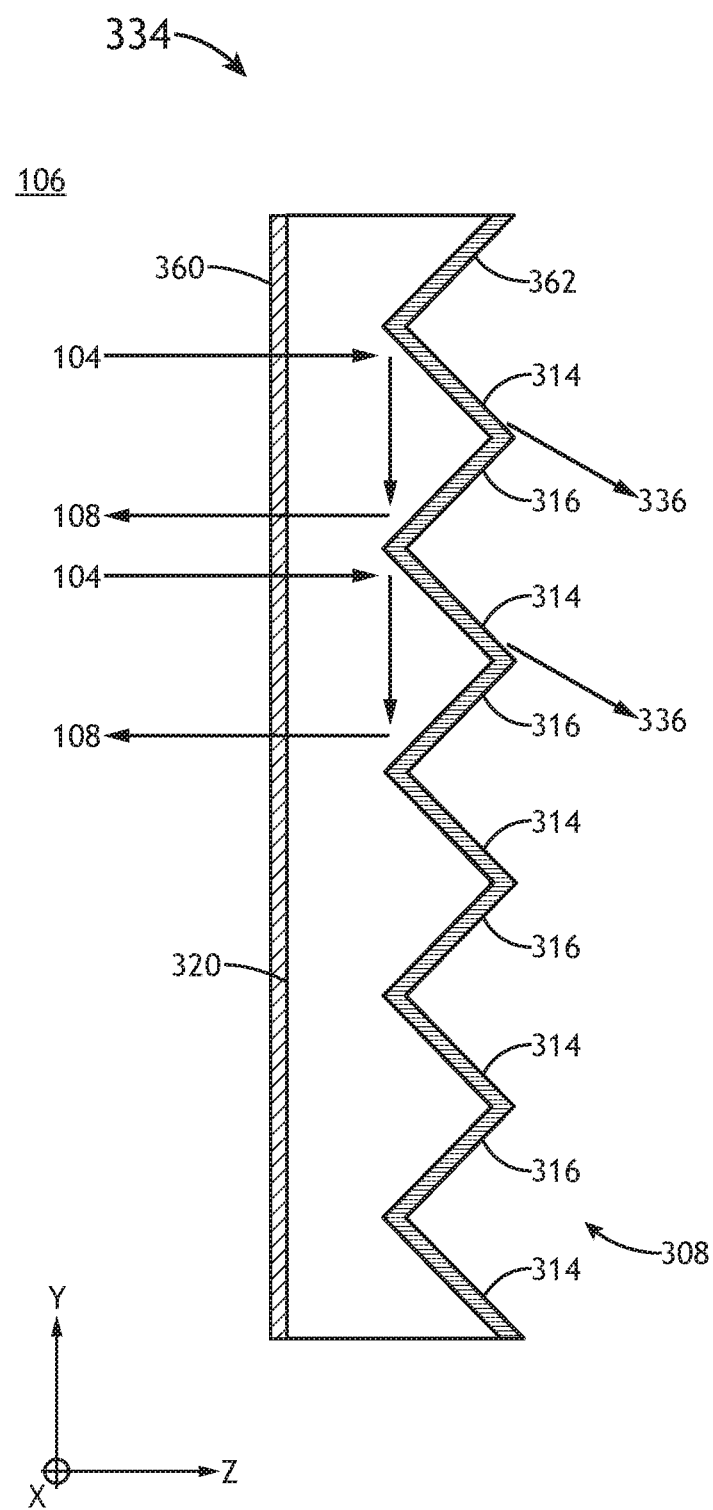
FIG. 3E is a side view of a TIR short-pass filter including a Fresnel prism providing total internal reflection on a grooved surface, in accordance with one or more embodiments of the present disclosure.

In some embodiments, a TIR short-pass filter 106 includes a Fresnel prism 306 oriented to provide total internal reflection on a grooved surface 308. FIG. 3E is a side view 334 of a TIR short-pass filter 106 including a Fresnel prism 306 providing total internal reflection on a grooved surface 308, in accordance with one or more embodiments of the present disclosure. In one embodiment, the apex angle 318 of the grooved surface 308 is configured to be 90 degrees to serve as a retroreflector. For example, broadband illumination 104 from a broadband illumination source 102 may enter the Fresnel prism 306 through a flat surface 320 and strike the first set of groove faces 314 at a 90-degree incidence angle in the Y-Z plane.

Wavelengths of the broadband illumination 104 below a TIR cutoff wavelength may then be reflected by the first set of groove faces 314, whereas wavelengths of the broadband illumination 104 above the critical angle for total internal reflection will transmit through the first set of groove faces 314 and thus exit the TIR short-pass filter 106. The reflected wavelengths of the broadband illumination 104 may then form filtered broadband illumination 108, whereas the transmitted wavelengths may form rejected illumination 336.

The filtered broadband illumination 108 may further undergo total internal reflection at the second set of groove faces 316 and subsequently exit the Fresnel prism 306 through the flat surface 320. In this regard, the flat surface 320 may operate as both an input and exit surface. It is recognized herein that multiple total internal reflections in the TIR short-pass filter 106 may facilitate a high contrast ratio between passed and rejected light.

The grooved surface 308 of the Fresnel prism 306 may thus provide retroreflective total internal reflection with a path length through the prism based on the total thickness 322. It is recognized herein that the total thickness 322 of the Fresnel prism 306 may be substantially reduced relative to a comparable triangular prism having a single apex angle 318 such that the Fresnel prism 306 may exhibit a correspondingly lower susceptibility to absorption-induced damage than a comparable triangular prism.

Figure 3F:
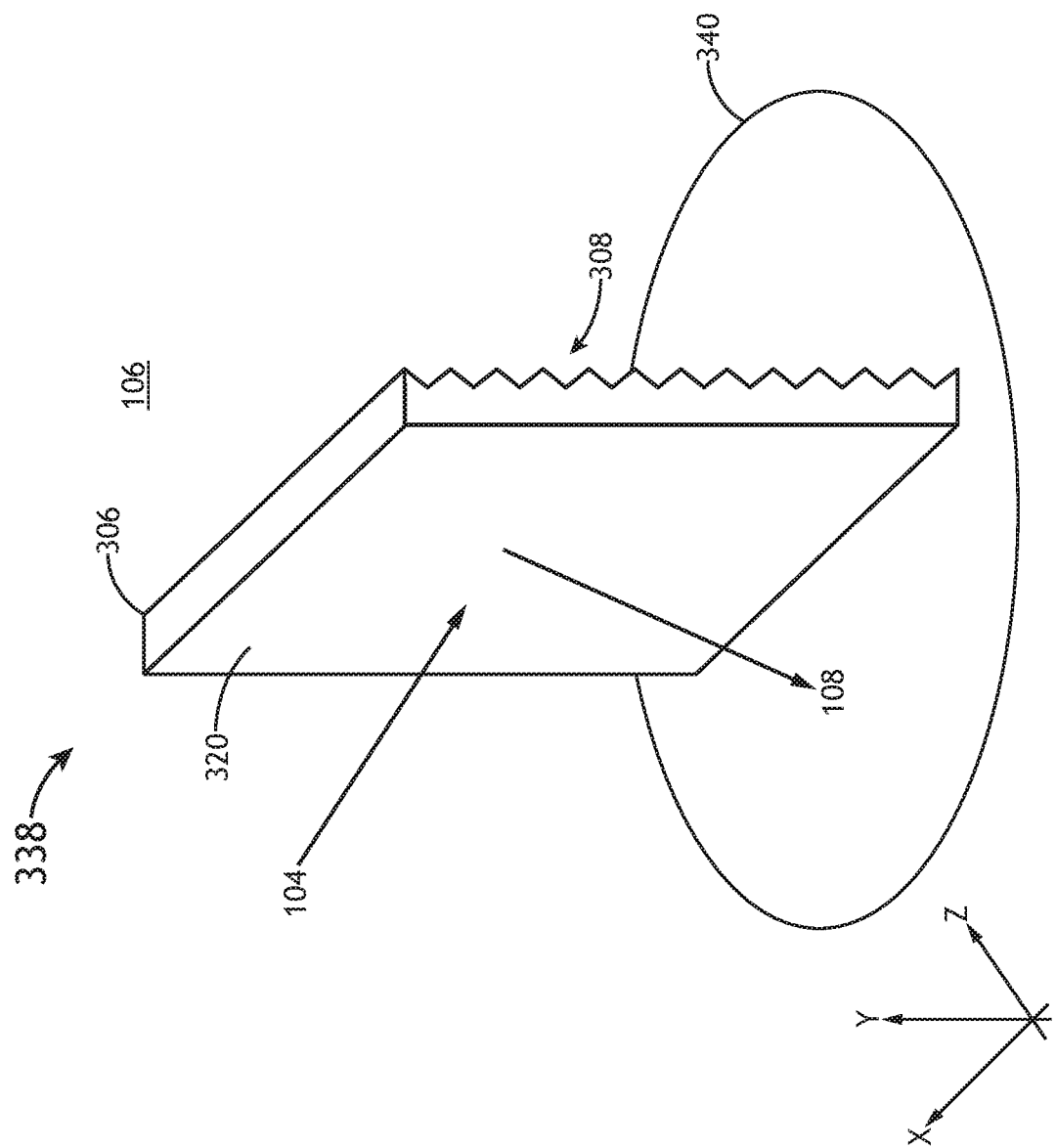
FIG. 3F is an orthonormal view of a TIR short-pass filter including a Fresnel prism illustrating a beam path of incident broadband illumination and filtered broadband illumination, in accordance with one or more embodiments of the present disclosure.

Referring now to FIG. 3F, in some embodiments, the Fresnel prism 306 is oriented to receive the broadband illumination 104 at a non-normal incidence angle in the X-Z plane. FIG. 3F is an orthonormal view 338 of a TIR short-pass filter 106 including a Fresnel prism 306 illustrating a beam path of incident broadband illumination 104 and filtered broadband illumination 108, in accordance with one or more embodiments of the present disclosure. In one embodiment, the broadband illumination 104 may be incident on the flat surface 320 at a non-normal incidence angle in the X-Z plane. For example, the Fresnel prism 306 may be mounted on a rotation stage 340 suitable for rotating the Fresnel prism 306 around the Z axis. By way of another example, the Fresnel prism 306 may be permanently or semi-permanently oriented to achieve a selected incidence angle of the broadband illumination 104 in the X-Z plane.

Orienting the Fresnel prism 306 to provide a non-normal incidence angle in the X-Z plane may impact the TIR short-pass filter 106 in various ways. For example, a non-normal incidence angle may provide separate beam paths for the incident broadband illumination 104 and the filtered broadband illumination 108 that would otherwise be retroreflected. In this regard, the filtered broadband illumination 108 may be readily captured and directed to additional components or systems. By way of another example, adjusting the incidence angle in the X-Z plane may facilitate tuning the TIR cutoff wavelength (and thus the spectrum of the filtered broadband illumination 108) by adjusting the incidence angle of the broadband illumination 104 on the grooved surface 308. As described previously herein, the critical angle associated with total internal reflection generally depends on the difference between the refractive indices of an interface (here, the prism material and the surrounding medium) and the wavelength. For example, a refraction angle of light at an interface generally increases with increasing photon energy (decreasing wavelength) under normal dispersion. In this regard, selecting a prism material and an incidence angle defines a cutoff wavelength in which wavelengths above the cutoff are transmitted and wavelengths below the cutoff undergo total internal reflection.

Figure 3G:
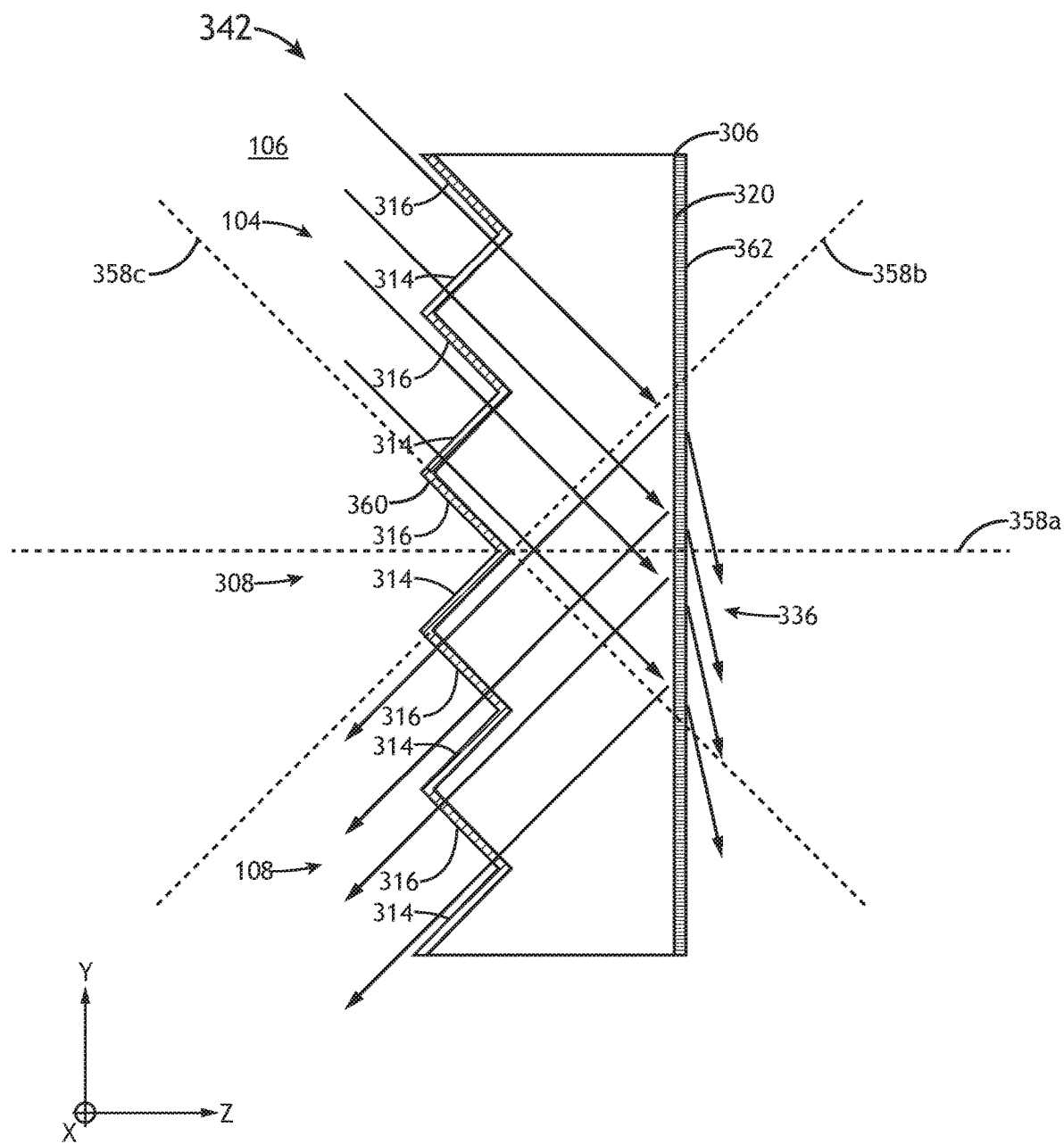
FIG. 3G is a side view of a TIR short-pass filter including a Fresnel prism providing total internal reflection on a flat surface, in accordance with one or more embodiments of the present disclosure.

In some embodiments, a TIR short-pass filter 106 includes a Fresnel prism 306 oriented to provide total internal reflection on one or more flat surfaces 320. FIG. 3G is a side view 342 of a TIR short-pass filter 106 including a Fresnel prism 306 providing total internal reflection on a flat surface 320, in accordance with one or more embodiments of the present disclosure. Accordingly, broadband illumination 104 from a broadband illumination source 102 may enter the Fresnel prism 306 through the first set of groove faces 314. For example, the Fresnel prism 306 may be oriented such that the broadband illumination 104 enters the first set of groove faces 314 at a normal incidence angle to avoid dispersion. Wavelengths of the broadband illumination 104 below a critical angle for total internal reflection may then be reflected by the flat surface 320, whereas wavelengths of the broadband illumination 104 above the critical angle for total internal reflection will transmit through the flat surface 320 and thus exit the TIR short-pass filter 106. The reflected wavelengths of the broadband illumination 104 may then form filtered broadband illumination 108.

In one embodiment, the grooved surface 308 of a Fresnel prism 306 is formed with a symmetric triangular side profile with a selected apex angle 318 to provide a symmetric path through the prism. For example, FIG. 3G illustrates a Fresnel prism 306 with an apex angle 318 of 90 degrees and a symmetric triangular side profile, in accordance with one or more embodiments of the present disclosure. Accordingly, broadband illumination 104 incident on the first set of groove faces 314 at a normal incidence angle may be reflected by the flat surface 320 at a corresponding 90 degree angle and may further exit through the second set of groove faces 316 at a normal incidence angle. Similarly, a Fresnel prism 306 may be fabricated with a symmetric triangular side profile and any selected apex angle 318 to adjust the angle of incidence of the broadband illumination 104 on the flat surface 320 and thus select the cutoff wavelength associated with total internal reflection.

Figure 3H:
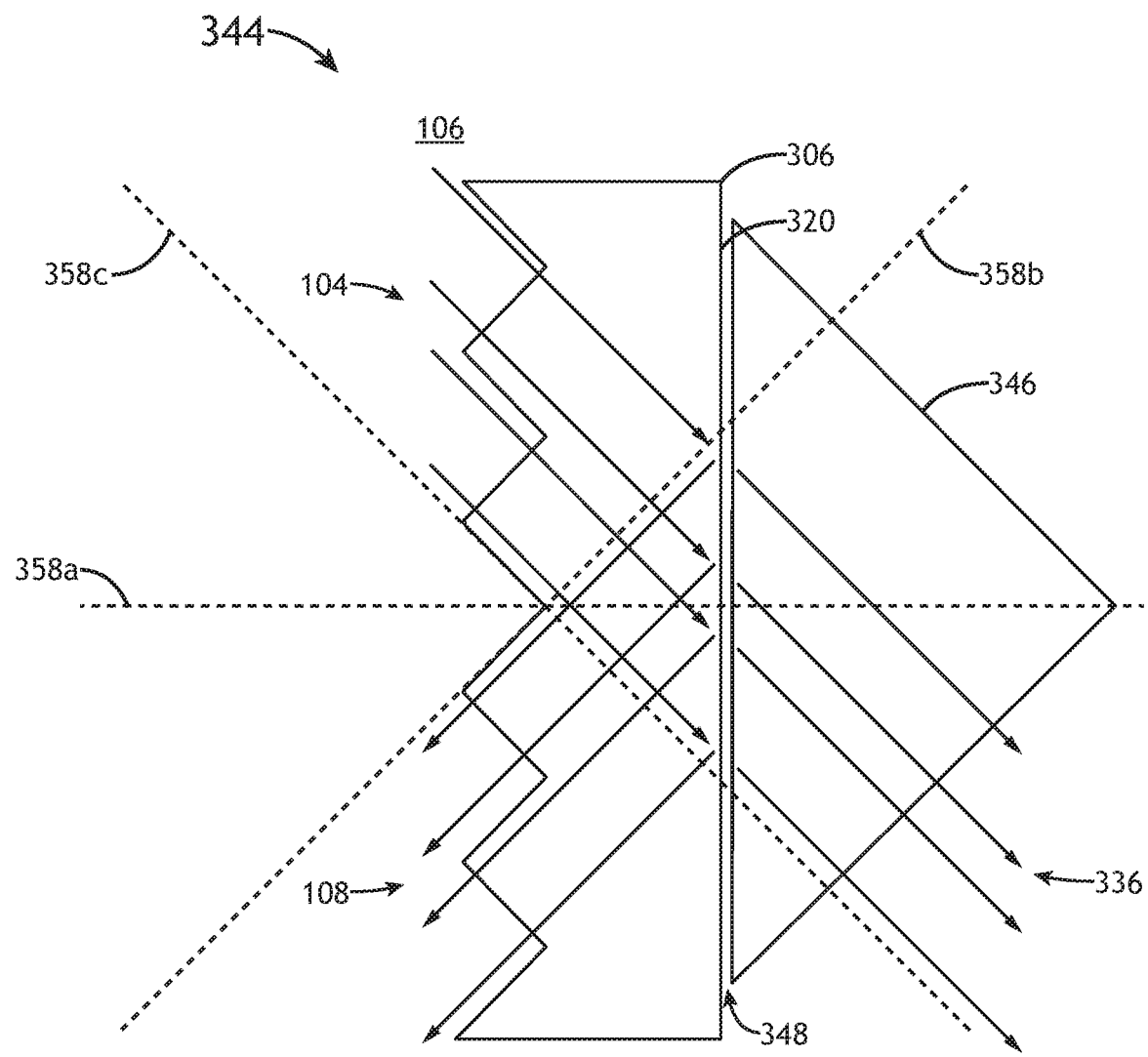
FIG. 3H is a side view of a TIR short-pass filter including a Fresnel prism and an out-of-band coupler to direct out-of-band wavelengths away from the Fresnel prism, in accordance with one or more embodiments of the present disclosure.

Referring now to FIG. 3H, the TIR short-pass filter 106 may include one or more elements to capture and/or dispose of the out-of-band wavelengths transmitted through TIR interfaces. For example, it may be desirable to efficiently direct out-of-band wavelengths away from the TIR short-pass filter 106 to avoid undesirable heating that may lead to distortion and/or damage. In particular, stray out-of-band wavelengths such as, but not limited to, IR wavelengths may heat the TIR short-pass filter 106 itself and/or surrounding materials. FIG. 3H is a side view 344 of a TIR short-pass filter 106 including a Fresnel prism 306 and an out-of-band coupler 346 to direct out-of-band wavelengths away from the Fresnel prism 306, in accordance with one or more embodiments of the present disclosure. In one embodiment, an out-of-band coupler 346 may include a material at least partially transparent to the out-of-band wavelengths located proximate to the prism face used for total internal reflection. It is recognized herein that wavelengths near the TIR cutoff wavelength may be refracted at a near-grazing angle with respect to the interface and may thus propagate along the surface of the interface. Accordingly, surface interactions and/or roughness may result in a portion of the out-of-band wavelengths coupling back into the Fresnel prism 306. Accordingly, the out-of-band coupler 346 may be separated from the Fresnel prism 306 (e.g., the flat surface 320 of FIG. 3H) by an air gap 348 such that the out-of-band wavelengths are refracted away from the Fresnel prism 306 by the out-of-band coupler 346. In this regard, the out-of-band wavelengths may be disposed of using any method known in the art such as, but not limited to, a beam dump.

Further, the out-of-band wavelengths may be collected by the out-of-band coupler 346 by any mechanism known in the art. For example, the out-of-band wavelengths may couple into the out-of-band coupler 346 at least partially by evanescent coupling.

It is to be understood that the TIR short-pass filter 106 is not required to include a Fresnel prism as illustrated in FIGS. 3A through 3H. In a general sense, a TIR short-pass filter 106 may include any geometry of prism suitable for providing total internal reflection on one or more faces. For example, a TIR short-pass filter 106 may include an element having grooved surface 308 similar to the Fresnel prism 306, but may have one or more curved faces to shape, focus, and/or collimate light. For example, the Fresnel prism 306 of FIG. 3E may include a curved surface in the place of the flat surface 320. In this regard, the curved surface may shape, focus, and/or collimate either the broadband illumination 104 from the broadband illumination source 102 and/or the filtered broadband illumination 108. By way of another example, the TIR short-pass filter 106 may include a prism configured to provide total internal reflection on multiple faces.

FIG. 3I is a side view 350 of a TIR short-pass filter 106 including a rhomboid prism 352, in accordance with one or more embodiments of the present disclosure. For example, the broadband illumination 104 from the broadband illumination source 102 may enter the rhomboid prism 352 at an input face 354, undergo total internal reflection at one or more flat surfaces 320, and exit at an output face 356.

In another embodiment, the orientation of the TIR short-pass filter 106 may be adjusted to facilitate adjustment (e.g., tuning) of the TIR cutoff wavelength. For example, a desired TIR cutoff wavelength for a TIR short-pass filter 106 formed from a given prism material may be selected by adjusting the incidence angle of the broadband illumination 104 on an internal surface of the TIR short-pass filter 106. As illustrated in, but not limited to, FIGS. 3G through 3I, the TIR short-pass filter 106 may be mounted on a rotation stage 358 suitable for rotating the TIR short-pass filter 106 to provide a selected incidence angle of the broadband illumination 104 on an internal TIR surface. Further, depending on the configuration of the TIR short-pass filter 106, the rotation stage 358 may be configured to rotate the TIR short-pass filter 106 around one or more axes to provide a desired incidence angle of the broadband illumination 104 on one or more internal faces. For example, as illustrated in FIG. 3I, a rotation stage 358 may rotate the TIR short-pass filter 106 around the X-axis to provide a selected incidence angle of the broadband illumination 104 on an internal TIR surface in the Y-Z plane. By way of another example, as illustrated in FIGS. 3G through 3I, a rotation stage (not shown) may rotate the TIR short-pass filter 106 along any of planes 358a-358d.

Referring again to FIGS. 3E and 3G, the TIR short-pass filter 106 may include anti-reflection (AR) coatings on one or more surfaces to mitigate undesired reflections at interfaces. For example, the reflected and transmitted power at an interface of wavelengths of light above the cutoff angle will be governed by the Fresnel equations as previously described herein. Accordingly, both in-band and out-of-band AR coatings may be selectively applied to facilitate overall throughput of the TIR short-pass filter 106 as well as to increase the contrast ratio of the passed (e.g., reflected) wavelengths to the rejected (e.g., transmitted) wavelengths.

In one embodiment, external surfaces of prism faces used as input and/or output faces may include an in-band AR coating 360 selected to mitigate reflections for wavelengths below the TIR cutoff wavelength at a selected angle. For example, an in-band AR coating 360 is illustrated on the flat surface 320 of FIG. 3E and on the first set of groove faces 314 and second set of groove faces 316 of FIG. 3G. In this regard, the in-band AR coating 360 may mitigate undesired reflections of in-band radiation entering and/or exiting the Fresnel prism 306 and may thus enhance the overall throughput of the TIR short-pass filter 106.

In another embodiment, external surfaces of prism faces used for total internal reflection include an out-of-band AR coating 362 selected to mitigate reflections for wavelengths above the TIR cutoff wavelength at a selected angle. For example, an out-of-band AR coating 362 is illustrated on the first set of groove faces 314 and second set of groove faces 316 of FIG. 3E and on the flat surface 320 of FIG. 3G. In this regard, the out-of-band AR coating 362 may mitigate undesired reflections of wavelengths above the cutoff wavelength and facilitate the transfer of the energy of the out-of-band wavelengths out of the Fresnel prism 306 and thus enhance the contrast ratio of passed to rejected wavelengths. Further, it is noted that the operating range of the out-of-band AR coating 362 may extend below the TIR cutoff wavelength without impeding the TIR performance.

The AR coatings (e.g., the in-band AR coating 360 and/or the out-of-band AR coating 362) may mitigate reflection at an interface based on any technique known in the art. For example, the AR coatings may include, but are not limited to, conventional dielectric stack coatings, structured surfaces having micro and/or nano-scale features selected to mitigate reflection, graded refraction index coatings, or nanocrystal coatings.

Further, it is to be understood that the descriptions of AR coatings in FIGS. 3E and 3G are provided solely for illustrative purposes and should not be interpreted as limiting. AR coatings may be included on any surface for any configuration of a TIR short-pass filter 106.

FIG. 4 is a plot 402 illustrating the reflectivity of MgF2 as a function of wavelength for a range of incidence angles. For example, the spectrum 404 of the broadband illumination 104 may include a broad range of wavelengths. As described previously herein, this spectrum 404 may be filtered through total internal reflection at one or more internal faces of the TIR short-pass filter 106. Further, the spectrum of the filtered broadband illumination 108 may be adjusted based on the TIR cutoff wavelength, which may be tuned by adjusting the incidence angle of the broadband illumination 104 on the internal faces of the TIR short-pass filter 106, as illustrated by TIR transmission signals 406 of MgF2 associated with multiple angles of incidence.

FIG. 5 is a flow diagram of a method 500 for filtering broadband illumination, in accordance with one or more embodiments of the present disclosure. In one embodiment, the method includes a step 502 of providing a TIR filter formed from a solid material including one or more input faces configured to receive broadband illumination, one or more filtering faces suitable for reflecting the broadband illumination, and one or more output faces configured to pass the reflected broadband illumination.

In another embodiment, the method includes a step 504 of orienting the TIR filter to reflect wavelengths of the broadband illumination below a selected cutoff wavelength by total internal reflection by the one or more selected (e.g., filtering) faces. For example, the cutoff wavelength may be selected based on the refractive indices of the solid material forming the TIR filter and the surrounding medium and a selected incidence angle of the broadband illumination on the one or more filtering faces of the TIR filter. In one embodiment, the TIR filter may be tunable such that the cutoff wavelength may be selected by rotating the TIR filter to adjust the incidence angle of the broadband illumination on the one or more filtering faces of the TIR filter.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected" or "coupled" to each other to achieve the desired functionality, and any two components capable of being so associated can also be viewed as being "couplable" to each other to achieve the desired functionality. Specific examples of "couplable" include but are not limited to physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction, and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. An apparatus for generating filtered laser-sustained plasma light comprising:
   one or more pump sources configured to generate pump illumination;
   a focusing element arranged to focus the pump illumination onto a plasma target to generate a plasma that emits broadband illumination;
   a collector element arranged to collect the broadband illumination from the plasma; and
   a total internal reflection (TIR) filter formed from a material at least partially transparent to the broadband illumination, the TIR filter including a single planar input face oriented to receive the broadband illumination and one or more filtering faces oriented to retroreflect wavelengths of the broadband illumination beam below a selected cutoff wavelength as filtered broadband illumination back through the single planar input face, wherein the cutoff wavelength is selected based on total internal reflection on the one or more filtering faces, wherein rejected broadband illumination beam exits the TIR filter through one or more output faces positioned opposite of the single planar input face.

2. The apparatus for generating filtered laser-sustained plasma light of claim 1, wherein the broadband illumination comprises:
   continuous-wave light.

3. The apparatus for generating filtered laser-sustained plasma light of claim 1, wherein the broadband illumination comprises:
   pulsed light.

4. The apparatus for generating filtered laser-sustained plasma light of claim 1, wherein the plasma target comprises:
   a gas plasma target, wherein a volume of the gas plasma target is contained within a gas containment structure having one or more transparent elements at least partially transparent to the pump illumination and the broadband illumination.

5. The apparatus for generating filtered laser-sustained plasma light of claim 1, wherein the plasma target comprises:
   a solid plasma target.

6. The apparatus for generating filtered laser-sustained plasma light of claim 1, wherein the plasma target comprises:
   a liquid plasma target.

7. The apparatus for generating filtered laser-sustained plasma light of claim 1, wherein the one or more filtering faces comprise:
   a grooved surface including a periodic distribution of angled faces distributed along a distribution direction, the angled faces including a first set of groove faces interlaced with a second set of groove faces, wherein the first set of groove faces intersect with the second set of groove faces at a common apex angle.

8. The apparatus for generating filtered laser-sustained plasma light of claim 7, wherein the one or more filtering faces comprise:
   two or more triangular prisms having apexes with the common apex angle arranged in a linear distribution, wherein faces of the two or more triangular prisms opposing the apexes form the single planar surface.

9. The apparatus for generating filtered laser-sustained plasma light of claim 8, wherein edges of the two or more triangular prisms are fused to provide a single element forming a Fresnel prism array.

10. The apparatus for generating filtered laser-sustained plasma light of claim 7,
    wherein the one or more filtering faces comprise:
    the first and second sets of groove faces.

11. The apparatus for generating filtered laser-sustained plasma light of claim 7, wherein the common apex angle is 90 degrees.

12. The apparatus for generating filtered laser-sustained plasma light of claim 1, further comprising:
    an out-of-band coupler positioned proximate to the one or more filtering faces, wherein the out-of-band coupler receives wavelengths of the broadband illumination transmitted through the one or more filtering faces and directs the received wavelengths away from the TIR filter.

13. The apparatus for generating filtered laser-sustained plasma light of claim 12, wherein a separation distance between the one or more filtering faces and the out-of-band coupler is selected such that the out-of-band coupler is configured to receive the wavelengths of broadband illumination transmitted through the one or more filtering faces by evanescent-wave coupling.

14. The apparatus for generating filtered laser-sustained plasma light of claim 1, further comprising:
    an anti-reflective coating disposed on the one or more filtering faces having an operational range including wavelengths of the broadband illumination beam above the selected cutoff wavelength.

15. The apparatus for generating filtered laser-sustained plasma light of claim 1, further comprising:
    an anti-reflective coating disposed on at least one of the one or more input faces or the one or more output faces having an operational range including at least wavelengths below the selected cutoff wavelength.

16. The apparatus for generating filtered laser-sustained plasma light of claim 1, further comprising:
    an anti-reflective coating on at least one of the one or more filtering faces, at least one of the one or more input faces, or at least one of the one or more output faces.

17. The apparatus for generating filtered laser-sustained plasma light of claim 16, wherein the anti-reflective coating comprises:
    at least one of a dielectric-stack anti-reflective coating, a graded refractive index coating, or a nano-structured anti-reflective coating.

18. The apparatus for generating filtered laser-sustained plasma light of claim 1, further comprising:
    a rotational stage securing the TIR filter, wherein the cutoff wavelength is selectable by rotating the TIR filter to adjust an incidence angle of the broadband illumination beam on the one or more filtering faces.

19. The apparatus for generating filtered laser-sustained plasma light of claim 1, wherein the selected range of wavelengths of the broadband illumination beam reflected from the one or more planar faces comprises:
    a range of approximately 100 nanometers to approximately 220 nanometers.

20. The apparatus for generating filtered laser-sustained plasma light of claim 1, wherein the selected range of wavelengths of the broadband illumination beam reflected from the one or more planar faces comprises:
    a range of approximately 115 nanometers to approximately 150 nanometers.

21. The apparatus for generating filtered laser-sustained plasma light of claim 1, wherein the selected range of wavelengths of the broadband illumination beam reflected from the one or more planar faces comprises:
    a range of approximately 115 nanometers to approximately 130 nanometers.

* * * * *